United States Patent
Cho et al.

(10) Patent No.: US 7,218,600 B2
(45) Date of Patent: May 15, 2007

(54) DIELECTRIC CONSTANT MEASURING APPARATUS, DIELECTRIC CONSTANT MEASURING METHOD, AND INFORMATION RECORDING/REPRODUCING APPARATUS

(75) Inventors: Yasuo Cho, 4-5-304, Komegafukuro 2-chome, Aoba-ku, Sendai-shi, Miyagi 980-0813 (JP); Atsushi Onoe, Saitama (JP)

(73) Assignees: Pioneer Corporation, Tokyo (JP); Yasuo Cho, Miyagi (JP)

( * ) Notice: Subject to any disclaimer, the term of this patent is extended or adjusted under 35 U.S.C. 154(b) by 339 days.

(21) Appl. No.: 10/489,170

(22) PCT Filed: Sep. 10, 2002

(86) PCT No.: PCT/JP02/09223

§ 371 (c)(1),
(2), (4) Date: Aug. 2, 2004

(87) PCT Pub. No.: WO03/023423

PCT Pub. Date: Mar. 20, 2003

(65) Prior Publication Data

US 2004/0263185 A1    Dec. 30, 2004

(30) Foreign Application Priority Data

Sep. 10, 2001    (JP)    ............................. 2001-274347

(51) Int. Cl.
*G11B 7/00*    (2006.01)
(52) U.S. Cl. ........................................ 369/126; 369/100
(58) Field of Classification Search ................ None
See application file for complete search history.

(56) References Cited

U.S. PATENT DOCUMENTS

| 2,872,529 | A | 2/1959 | Hollmann et al. |
| 4,320,491 | A | 3/1982 | Rustman ..................... 369/126 |
| 4,455,638 | A | 6/1984 | Wilson |
| 4,489,278 | A | 12/1984 | Sawazaki ..................... 324/457 |

(Continued)

FOREIGN PATENT DOCUMENTS

GB    644 426 A    10/1950

(Continued)

OTHER PUBLICATIONS

Patent Abstracts of Japan, vol. 1996, No. 07, Jul. 31, 1996 & JP 08 075806 A, Mar. 22, 1996.

(Continued)

*Primary Examiner*—Muhammad Edun
(74) *Attorney, Agent, or Firm*—Nixon & Vanderhye, PC

(57) ABSTRACT

A dielectric constant measuring apparatus for measuring a dielectric constant of a dielectric substance is provided with: a cantilever having a small projection on a tip side of a cantilevered electric conductor; an electrode which is placed around the cantilever and is earthed; an inductor (L) placed so as to constitute a resonance circuit together with a capacitance (Cs) in a small area of the dielectric substance that the cantilever contacts; an oscillating device connected to the resonance circuit; a demodulating device for demodulating an oscillation frequency of the oscillating device; and a dielectric constant detecting device for detecting a dielectric constant information from a demodulation signal of the demodulating. The dielectric constant measuring apparatus can be applied to an information recording/reproducing apparatus using a dielectric record medium.

22 Claims, 12 Drawing Sheets

U.S. PATENT DOCUMENTS

| | | | |
|---|---|---|---|
| 5,418,029 A | 5/1995 | Yamamoto et al. | 428/64.2 |
| 5,481,527 A | 1/1996 | Kasanuki et al. | 369/126 |
| 5,488,602 A | 1/1996 | Yamano et al. | 369/126 |
| 5,646,932 A | 7/1997 | Kuribayashi et al. | 369/126 |
| 5,751,685 A | 5/1998 | Yi | 369/126 |
| 5,777,977 A | 7/1998 | Fujiwara et al. | 369/126 |
| 5,808,977 A | 9/1998 | Koyanagi et al. | 369/127 |
| 5,914,920 A | 6/1999 | Yokogawa | 369/275.3 |
| 5,946,284 A | 8/1999 | Chung et al. | 369/126 |
| 5,985,404 A | 11/1999 | Yano et al. | |
| 6,197,989 B1 | 3/2001 | Furukawa et al. | 556/450 |
| 6,477,132 B1 | 11/2002 | Azuma et al. | 369/126 |
| 6,510,130 B2 | 1/2003 | Hayashi et al. | 369/275.3 |
| 6,515,957 B1 | 2/2003 | Newns et al. | 369/126 |
| 6,653,630 B2 | 11/2003 | Rosenman et al. | 250/306 |
| 6,762,402 B2 | 7/2004 | Choi et al. | 250/234 |
| 6,841,220 B2 | 1/2005 | Onoe et al. | 428/66.7 |
| 6,912,193 B2 | 6/2005 | Cho et al. | 369/126 |
| 6,965,545 B2 | 11/2005 | Hino et al. | 369/13.54 |
| 7,065,033 B2 | 6/2006 | Onoe et al. | 369/126 |
| 7,149,180 B2 | 12/2006 | Onoe et al. | 369/276 |
| 2002/0105249 A1 | 8/2002 | Yoshida et al. | 310/311 |
| 2002/0118906 A1 | 8/2002 | Onoe | 385/14 |
| 2002/0131669 A1 | 9/2002 | Onoe et al. | 385/14 |
| 2003/0021213 A1 | 1/2003 | Hagiwara | 369/101 |
| 2003/0053400 A1 | 3/2003 | Cho et al. | 369/126 |
| 2004/0027935 A1 | 2/2004 | Cho et al. | 369/126 |
| 2004/0042351 A1 | 3/2004 | Onoe et al. | 369/13.01 |
| 2004/0090903 A1 | 5/2004 | Cho et al. | 369/126 |
| 2004/0105373 A1 | 6/2004 | Maeda et al. | 369/101 |
| 2004/0105380 A1 | 6/2004 | Cho et al. | 369/126 |
| 2004/0114913 A1 | 6/2004 | Kume | 386/125 |
| 2004/0252621 A1 | 12/2004 | Cho et al. | 369/126 |
| 2004/0263185 A1 | 12/2004 | Cho et al. | 324/636 |
| 2005/0047288 A1 | 3/2005 | Maeda et al. | 369/53.25 |
| 2005/0098532 A1 | 5/2005 | Onoe et al. | 216/22 |
| 2005/0099895 A1 | 5/2005 | Maeda et al. | 369/13.01 |
| 2005/0122886 A1 | 6/2005 | Takahashi et al. | 369/126 |

FOREIGN PATENT DOCUMENTS

| | | |
|---|---|---|
| GB | 1 484 256 | 9/1977 |
| JP | 56-107338 | 8/1981 |
| JP | 57-200956 | 12/1982 |
| JP | 08-075806 | 3/1996 |
| JP | 10-334525 | 12/1998 |
| JP | 2003085969 | 3/2003 |

OTHER PUBLICATIONS

Patent Abstracts of Japan, vol. 0051, No. 13, Nov. 13, 1981 & JP 56 107338 A, Aug. 26, 1981.

62th Japan Society of Applied Physics Lecture Meeting (2001.9 Aichi Institute of Technology) 12p-ZR-2.

Kazuta et al, "Determination of crystal polarities of piezoelectric thin film using scanning nonlinear dielectric microscopy", Journal of European Ceramic Society 21 (2001) 1581-1584.

The Institution of Electrical Engineers, Stevenage, GB; Jun. 1, 2002; Hiranaga et al, "Nano-sized in inverted domain formation in stoichiometric LiTaO/sub3/single crystal using Scanning Nonlinear Dielectric Microscopy", XP002292217.

Cho et al, "Scanning nonlinear dielectric microscopy with nanometer resolution", Journal of European Ceramic Society 21 (2001) 2131-2134.

Cho et al., Nano domain engineering using scanning nonlinear dielectric microscopy, Oct. 29, 2001, IEE-NANO 2001, pp. 352-357.

«DIELECTRIC CONSTANT MEASURING APPARATUS, DIELECTRIC CONSTANT MEASURING METHOD, AND INFORMATION RECORDING/REPRODUCING APPARATUS»

This application is the U.S. national phase of international application PCT/JP02/09223, filed in English on 10 Sep. 2002, which designated the U.S. PCT/JP02/09223 claims priority to JP Application No. 2001-274347, filed 10 Sep. 2001. The entire contents of these applications are incorporated herein by reference.

TECHNICAL FIELD

The present invention relates to a dielectric constant measuring apparatus and a dielectric constant measuring method which measure a dielectric constant of a small area of a dielectric substance, and an information recording/reproducing apparatus to which this dielectric constant measuring technique is applied.

BACKGROUND ART

In recent years, many kinds of ferroelectric materials and piezoelectric materials have been developed and used for a supersonic, an optical device and a memory and the like. In association with it, a development of methods of measuring a residual polarization distribution of the ferroelectric material and a local anisotropy of the piezoelectric material has been advanced. With regard to the development in this field, the inventors of this application have developed a scanning nonlinear dielectric microscopy (SNDM) as a technique for a purely electrical detection of a polarization distribution of a material and a local anisotropy without any disturbance of a shield effect caused by free charges disposed on a surface.

The SNDM is the technique for detecting the condition of the polarization and the local anisotropy from a distribution measurement of a nonlinear dielectric constant of a material. As the technique of the SNDM, the development has been successively advanced such as a distribution constant type probe using a coaxial resonator and a small concentrated constant type probe using an LC resonator. In this way, according to the SNDM, nondestructive measurement can be performed on the polarization distribution of a dielectric substance in an extremely small area. On the other hand, according to the SNDM, the polarization can be controlled by applying a predetermined electric field.

The method using the SNDM converts a capacitance change of a dielectric domain (i.e. small area of the dielectric substance) into a frequency change in principle. Thus, a distribution in a polarization direction of the dielectric substance is easily determined. However, there is a problem in a quantitative measurement of a dielectric constant. In order to solve this problem and measure a distribution of a dielectric constant, the inventor of this application et al. proposed that the quantitative measurement of the dielectric constant could be attained by using a tungsten probe placed vertically to a surface of a dielectric substance, using an analysis model simulated with a shape of a prove tip formed by an electrical field polishing as a sphere and also determining a floating capacitance in a measurement system from a measurement of a dielectric sample whose dielectric constant had been known in advance and thereby canceling out the floating capacitance on the basis of it. However, this method could cope with only the measurement in a rough region until a μm order at most because of the limit of a resolution in the measurement system.

DISCLOSURE OF INVENTION

It is therefore an object of the present invention to provide a dielectric constant measuring apparatus and a dielectric constant measuring method that enable a measurement of a dielectric constant distribution in a small area of a dielectric substance and are suitable for a material evaluation of a dielectric material at a nm (nano-meter) order, for example, an evaluation about a small area which serves as a part of a construction of a semiconductor electric circuit or the like, and an information recording/reproducing apparatus to which this technique is applied and which enables a recording/reproducing operation at a high density.

The above object of the present invention can be achieved by a dielectric constant measuring apparatus for measuring a dielectric constant of a dielectric substance, provided with: a probe having a small projection on a tip side of a cantilevered electric conductor; an electrode which is placed around the probe and which is set at a predetermined electric potential; an inductor placed so as to constitute a resonance circuit together with a capacitance in a small area of the dielectric substance that the probe contacts; an oscillating device connected to the resonance circuit; a demodulating device for demodulating an oscillation frequency of the oscillating device; and a detecting device for detecting dielectric constant information from a demodulation signal of the demodulating device.

According to the dielectric constant measuring apparatus of the present invention, the dielectric constant in the small area of the dielectric substance can be measured with the nm order resolution, nondestructively, and quantitatively. The probe is constructed by, for example, an electric conductor (a conductive material) which is in the form of a cantilever and which has a predetermined length, and a small (micro) projection which is placed in the tip side of the cantilevered electric conductor. The projection of the prove is made to be in contact with a small area of the dielectric substance to measure the dielectric constant. This probe is referred to as "cantilever" hereinbelow. As the cantilevered electric conductor portion of the cantilever has elasticity, an optimum contact force can be obtained. Therefore, the contact ability and the trace ability of the cantilever with respect to the dielectric substance can be improved. The projection portion of the cantilever is conductive, as well.

The cantilever whose projection tip is manufactured to a sphere of the nm order in the curvature radius is preferably used. It is possible to use a cantilever for an AFM (Atomic Force Microscope) to which the electric conductivity is added by coating metal such as platinum, and the like.

The resonance circuit is provided with: the capacitance under the cantilever in the small area to be measured; the external inductor; a floating capacitance; and the like, and an inductance is selected such that its resonance frequency is, for example, about 1 GHz.

The oscillating device is connected to the resonance circuit and is oscillated at the frequency based on the resonance frequency. Therefore, the oscillation frequency depends on the capacitance under the cantilever and comes to relate directly to the change of the capacitance, i.e. the dielectric constant in the measurement portion of the dielectric substance. The detection of this frequency change enables the dielectric constant to be measured. Incidentally, the relatively large floating capacitance parallel to the capacitance under the cantilever is added into the resonance circuit in reality. However, as described in detail later, the floating capacitance can be obtained by using a known dielectric sample or by using a calculating device in a known method. Thus, the change of the oscillation frequency corresponding to the change of the capacitance under the cantilever can be obtained by separating it from the whole capacitance including the floating capacitance.

The demodulating device demodulates the oscillation frequency outputted from the oscillating device and converts it to an AM signal corresponding to the capacitance. As described above, the oscillation frequency is modulated by the capacitance under the cantilever, and the device is used for demodulating this and detecting the capacitance.

The detecting device quantitatively detects the capacitance under the cantilever from the demodulation signal outputted from the demodulating device. This amount relates closely to the dielectric constant in the small area of the dielectric substance, and consequently, it enables the dielectric constant to be determined. Moreover, if the dielectric constant corresponds to record information, it becomes possible to construct an information recording/reproducing apparatus provided with the dielectric substance as a record medium.

In one aspect of the dielectric constant measuring apparatus of the present invention, the detecting device includes a calculating device for determining the dielectric constant of the dielectric substance by using oscillation frequency data which is obtained by making the probe contact with a dielectric sample having a known dielectric constant distribution and making the oscillating device oscillate on the basis of the capacitance of a small area of the dielectric sample.

The capacitance that is influenced the measurement of the dielectric constant of the dielectric substance includes not only the capacitance under the tip of the projection of the cantilever but also the capacitance generated between cantilevered electric conductor portion of the cantilever and the dielectric substance, and further includes the capacitance generated between a member which holds the cantilever and the dielectric substance, and furthermore includes the floating capacitance of the whole of the measurement system. This makes the measurement of the dielectric constant of the dielectric substance difficult. However, according to the above aspect, it becomes easy to measure the dielectric constant of the dielectric substance. Namely, according to this aspect, the oscillation frequency is measured in advance using a dielectric sample having a known dielectric constant, and this measuring result is used as oscillation frequency data. For example, the oscillation frequency data is data indicating a relationship between oscillation frequencies and dielectric constants with respect to the dielectric sample. When actually measuring the dielectric constant of the dielectric substance, the measurement is carried out, referring to the oscillation frequency data. At this time, the dielectric constant can be determined on the basis of the actually detected oscillation frequency and the relationship between the oscillation frequencies and the dielectric constants with respect to the dielectric sample indicated by the oscillation frequency data.

In this aspect, the calculating device calculates an average dielectric constant of the dielectric substance on the basis of: (i) a working curve, which indicates a relationship between dielectric constants and oscillation frequencies with respect to a plurality of dielectric samples which have different known dielectric constants, and which is created on the basis of the oscillation frequency data which is obtained by making the prove contact with each of the plurality of dielectric samples and making the oscillating device oscillate on the basis of the capacitance of a small area of each of the plurality of dielectric samples; and (ii) an oscillation frequency obtained when the prove is stopped in a condition that the probe is contact with the dielectric substance having a small dielectric constant distribution on its surface within a range including a portion where the probe and a member holding the probe face the dielectric substance, and then determines the dielectric constant distribution from changes of an oscillation frequency corresponding to the dielectric constant distribution by relatively scanning the probe contacting the dielectric substance.

According to this aspect, the working curve is created in advance using the plurality of dielectric samples. In the working curve, individual characteristics of the measurement system (i.e. this dielectric constant measuring apparatus) are reflected. Then, the average dielectric constant of the dielectric substance to be measured is firstly calculated from this working curve and the oscillation frequency when the prove is stopped in a condition that the probe is contact with the dielectric substance. Then, the dielectric constant distribution of the dielectric substance is determined from the change of the oscillation frequency by scanning the probe on the dielectric substance. Therefore, with the relatively simple structure, it becomes possible to measure the dielectric constant distribution in the small area of the dielectric substance in high quality.

In another aspect of the dielectric constant measuring apparatus of the present invention, it is provided with an alternating current signal generating device for generating an alternating current signal applied to the probe.

According to this aspect, the alternating current signal generating device generates an alternating voltage with a relatively low frequency, for example, about 5 KHz, and is applied to the cantilever. The dielectric substance is biased at this frequency, and this component is included in the output from the demodulating device, which is used as a reference signal when detecting the dielectric constant.

In another aspect of the dielectric constant measuring apparatus of the present invention, it is provided with a cutoff device for cutting off the alternating current signal with respect to the oscillating device.

According to this aspect, it becomes possible to prevent the effect of the alternating current signal by the alternating current signal generating device to the oscillating device. The cutoff device can be constructed using a low cut filter provided with a capacitor and an inductor between the alternating current signal generating device and the oscillating device, for example.

In another aspect of the dielectric constant measuring apparatus of the present invention, the dielectric constant information is detected by the detecting device using a synchronous detection by the demodulation signal and the alternating current signal.

According to this aspect, since the demodulation device biased by the alternating current signal is detected by referring to the alternating current signal, the information on the dielectric constant in high quality with little noise effect is detected.

In another aspect of the dielectric constant measuring apparatus of the present invention, it is provided with a plurality of the probes and a plurality of the alternating current signal generating devices, and the plurality of the alternating current signal generating devices supply a plurality of the alternating current signals which have different frequencies each other to the plurality of the probes, respectively.

According to this aspect, the detection of the dielectric constant can be carried out at more than one portion at the same time. Moreover, the alternating current signals with different frequencies are applied to the cantilevers, respectively. Therefore, the signal detected by each cantilever can be separated from the demodulation signal by referring each alternating current signal, and the signal can be reproduced.

In another aspect of the dielectric constant measuring apparatus of the present invention, the electrode is grounded.

According to this aspect, the detection of the dielectric constant can be stably carried out. Incidentally, the electrode may be set at a predetermined electric potential except for the ground potential.

In another aspect of the dielectric constant measuring apparatus of the present invention, it is provided with a stage on which the dielectric substance is placed. The stage is located opposite the probe, and it is grounded.

According to this aspect, the detection of the dielectric substance can be stably carried out by putting the dielectric substance on the grounded stage.

In another aspect of the dielectric constant measuring apparatus of the present invention, the dielectric substance is a ferroelectric substance.

According to this aspect, it is possible to measure the dielectric constant on the super small area and a plus/minus sign of non-linear dielectric constant distribution in high accuracy, compared with a normal dielectric substance.

The above object of the present invention can be achieved by a first information recording/reproducing apparatus for recording and reproducing information with respect to a tape-like dielectric record medium, provided with: a moving device for moving the dielectric record medium straight; a probe having a small projection on a tip side of a cantilevered electric conductor, for reading out and recording the information by being made to be in contact with the dielectric record medium; an electrode which is placed around the probe and which is set at a predetermined electric potential; and a circuit device for generating a signal corresponding to the information and recording the signal through the probe, and for reading out and reproducing the recorded information through the probe.

According to the first information recording/reproducing apparatus, since the cantilever is used as an electrode for recording and reproducing the signal, it is possible to construct the recording/reproducing apparatus using a high density and large capacity tape-like dielectric record medium. Moreover, the record medium can be made by forming a dielectric material on a tape-like conductive substrate by using a known sputtering technique or the like.

In one aspect of the first information recording/reproducing apparatus of the present invention, it is provided with a plurality of the probes and a plurality of the alternating current signal generating devices for supplying a plurality of the alternating current signals which have different frequencies each other to the plurality of the probes, respectively.

According to this aspect, the recording and reproducing of the information can be carried out by using more than one probe at the same time. Therefore, it is possible to record and reproduce the large amount of information at a high speed. Moreover, the alternating current signals with different frequencies are applied to the cantilevers, respectively. Therefore, it is possible to extract the information in high quality without interference of other signals.

In another aspect of the first information recording/reproducing apparatus of the present invention, the electrode is grounded.

According to this aspect, the recording and reproduction of the information can be stably carried out. Incidentally, the electrode may be set at a predetermined electric potential except for the ground potential.

In another aspect of the first information recording/reproducing apparatus of the present invention, it is provided with a conductive base which is placed such that the dielectric record medium is sandwiched between the probe and the conductive base.

According to this aspect, the recording and reproduction of the information can be stably carried out by making the probe contact with the dielectric record medium placed on the conductive base.

Incidentally, the conductive base may be grounded. Alternatively, the conductive base may be set at predetermined electric potential except for a ground potential. For example, the electric potential of the conductive base may be set at the electric potential equal to or different from that of the electrode place around the probe. If the conductive base is set at the ground electric potential or a predetermined electric potential, the recording of the information can be stably carried out.

In another aspect of the first information recording/reproducing apparatus of the present invention, the dielectric record medium is made by using a ferroelectric substance.

According to this aspect, it is possible to record the information on the small area of the record medium at a high density, compared with the case of using a normal dielectric substance.

The above object of the present invention can be achieved by a second information recording/reproducing apparatus for recording and reproducing information with respect to a disc-like dielectric record medium, provided with: a rotating device for rotating the dielectric record medium; a probe having a small projection on a tip side of a cantilevered electric conductor, for reading out and recording the information by being made to be in contact with the dielectric record medium; an electrode which is placed around the probe and which is set at a predetermined electric potential; a circuit device for generating a signal corresponding to the information and recording the signal through the probe, and for reading out and reproducing the recorded information through the probe; and a moving device for moving the probe in a radius direction of the dielectric record medium.

According to the second information recording/reproducing apparatus, since the cantilever is used as an electrode for recording and reproducing the signal, it is possible to construct the recording/reproducing apparatus using a high density and large capacity tape-like dielectric record medium. Moreover, the record medium can be made by forming a dielectric material on a disc-like conductive substrate by using a known sputtering technique or the like.

In one aspect of the second information recording/reproducing apparatus of the present invention, it is provided with a plurality of the probes and a plurality of the alternating current signal generating devices for supplying a plurality of the alternating current signals which have different frequencies each other to the plurality of the probes, respectively.

According to this aspect, the recording and reproducing of the information can be carried out by using more than one probe at the same time. Therefore, it is possible to record and reproduce the large amount of information at a high speed. Moreover, the alternating current signals with different frequencies are applied to the cantilevers, respectively. Therefore, it is possible to extract the information in high quality without interference of other signals.

In another aspect of the second information recording/reproducing apparatus of the present invention, the electrode is grounded.

According to this aspect, the recording and reproduction of the information can be stably carried out. Incidentally, the electrode may be set at a predetermined electric potential except for the ground potential.

In another aspect of the second information recording/reproducing apparatus of the present invention, it is provided with a conductive rotation base, which is placed such that the dielectric record medium is sandwiched between the probe and the conductive base, and which is rotated by the rotating device.

According to this aspect, the recording and reproduction of the information can be stably carried out by making the probe contact with the dielectric record medium placed on the conductive rotation base.

Incidentally, the conductive rotation base may be grounded. Alternatively, the conductive rotation base may be set at predetermined electric potential except for a ground potential. For example, the electric potential of the conductive rotation base may be set at the electric potential equal to or different from that of the electrode place around the probe. If the conductive rotation base is set at the ground electric potential or a predetermined electric potential, the recording of the information can be stably carried out.

In another aspect of the information recording/reproducing apparatus of the present invention, the dielectric record medium is made by using a ferroelectric substance.

According to this aspect, it is possible to record the information on the small area of the record medium at a high density, compared with the case of using a normal dielectric substance.

The above object of the present invention can be achieved by a dielectric constant measuring method of measuring a dielectric constant of a dielectric substance by using a dielectric constant measuring apparatus provided with: a probe having a small projection on a tip side of a cantilevered electric conductor; an electrode which is placed around the probe and which is set at a predetermined electric potential; an inductor placed so as to constitute a resonance circuit together with a capacitance in a small area of the dielectric substance that the probe contacts; an oscillating device connected to the resonance circuit; a demodulating device for demodulating an oscillation frequency of the oscillating device; and a detecting device for detecting dielectric constant information from a demodulation signal of the demodulating device. The dielectric constant measuring method is provided with: a working curve creating process of creating a working curve, which indicates a relationship between dielectric constants and oscillation frequencies with respect to a plurality of dielectric samples which have different known dielectric constants, on the basis of the oscillation frequency data which is obtained by making the prove contact with each of the plurality of dielectric samples and making the oscillating device oscillate on the basis of the capacitance of a small area of each of the plurality of dielectric samples; a calculating process of calculating an average dielectric constant on the basis of the working curve and an oscillation frequency obtained when the prove is stopped in a condition that the probe is contact with the dielectric substance having a small dielectric constant distribution on its surface within a range including a portion where the probe and a member holding the probe face the dielectric substance; and a determining process of determining the dielectric constant distribution from changes of an oscillation frequency corresponding to the dielectric constant distribution by relatively scanning the probe contacting the dielectric substance.

According to this method, the working curve is created in advance using the plurality of dielectric samples. In the working curve, individual characteristics of the measurement system (i.e. the dielectric constant measuring apparatus in which this method is carried out) are reflected. Then, the average dielectric constant of the dielectric substance to be measured is firstly calculated from this working curve and the oscillation frequency when the prove is stopped in a condition that the probe is contact with the dielectric substance. Then, the dielectric constant distribution of the dielectric substance is determined from the change of the oscillation frequency by scanning the probe on the dielectric substance. Therefore, with the relatively simple structure, it becomes possible to measure the dielectric constant distribution in the small area of the dielectric substance in high quality.

In one aspect of the dielectric constant measuring method of the present invention, the dielectric substance is a ferroelectric substance.

According to this aspect, it is possible to measure the dielectric constant distribution on the super small area in high accuracy, compared with a normal dielectric substance.

The nature, utility, and further features of this invention will be more clearly apparent from the following detailed description with reference to preferred embodiments of the invention when read in conjunction with the accompanying drawings briefly described below.

BEST MODE FOR CARRYING OUT THE INVENTION

Preferred embodiments of the present invention will be explained below with reference to the drawings, respectively.

First Embodiment

Figures 2A, 2B, 2C:
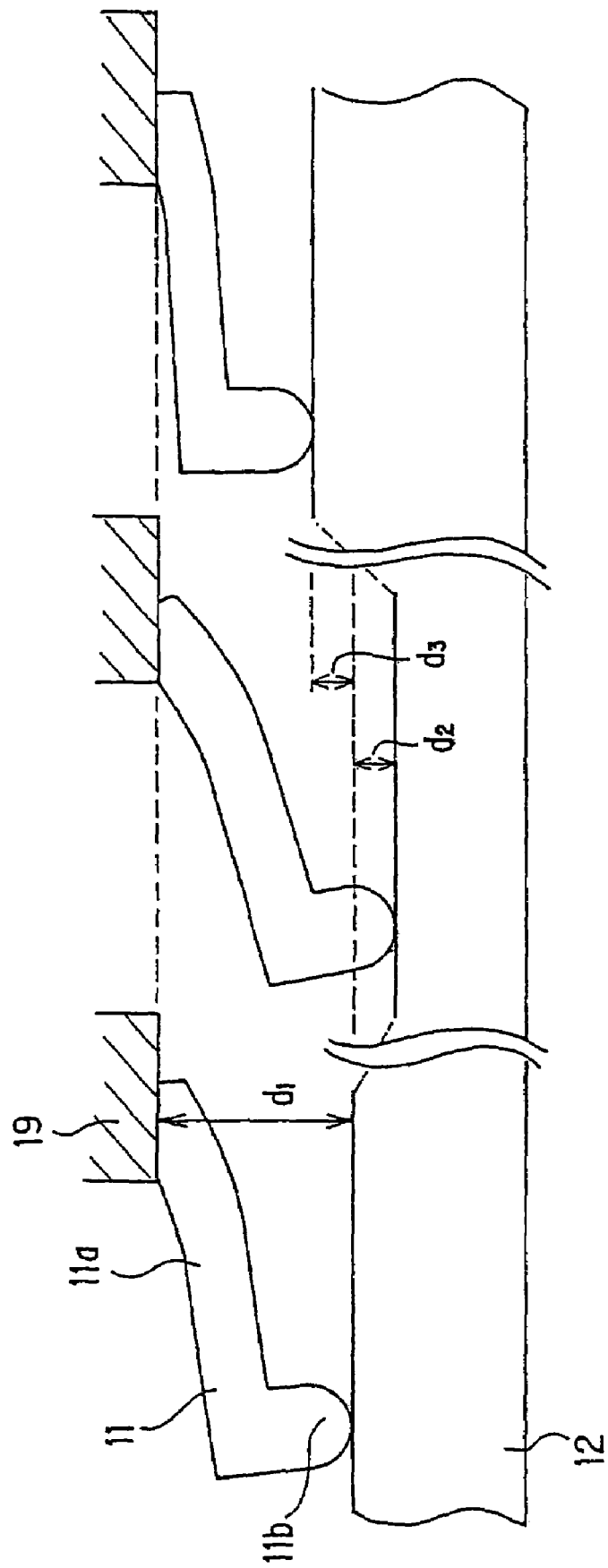
FIG. 2A is a view showing a contact property with a dielectric substance of a cantilever.
FIG. 2B is a view showing a contact property with a dielectric substance of a cantilever.
FIG. 2C is a view showing a contact property with a dielectric substance of a cantilever.
Figure 3A:
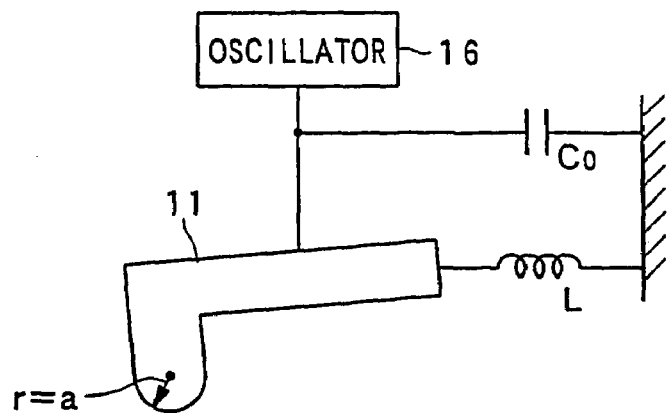
FIG. 3A is a view illustrating a relation between a change in a capacitance and a change in a resonance frequency.
Figure 3B:
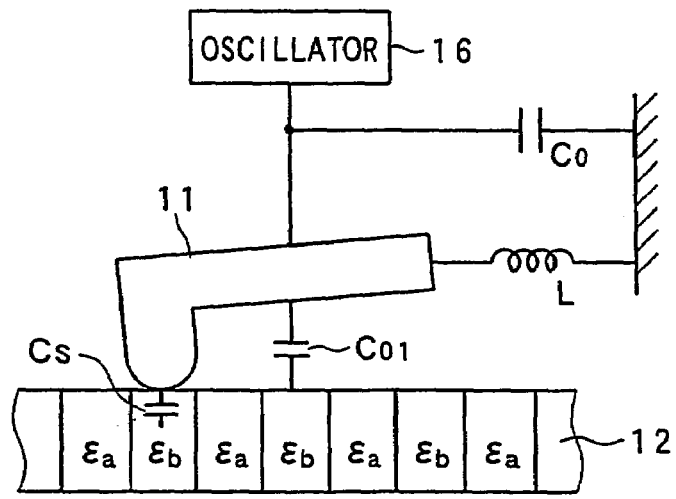
FIG. 3B is a view illustrating a relation between a change in a capacitance and a change in a resonance frequency.
Figure 3C:
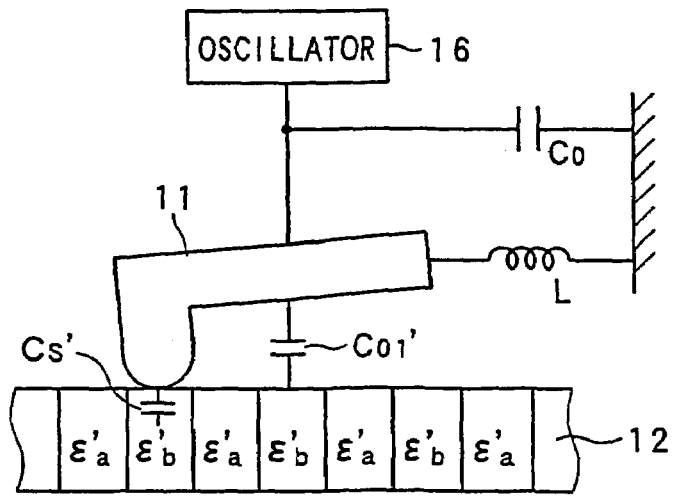
FIG. 3C is a view illustrating a relation between a change in a capacitance and a change in a resonance frequency.
Figure 4:
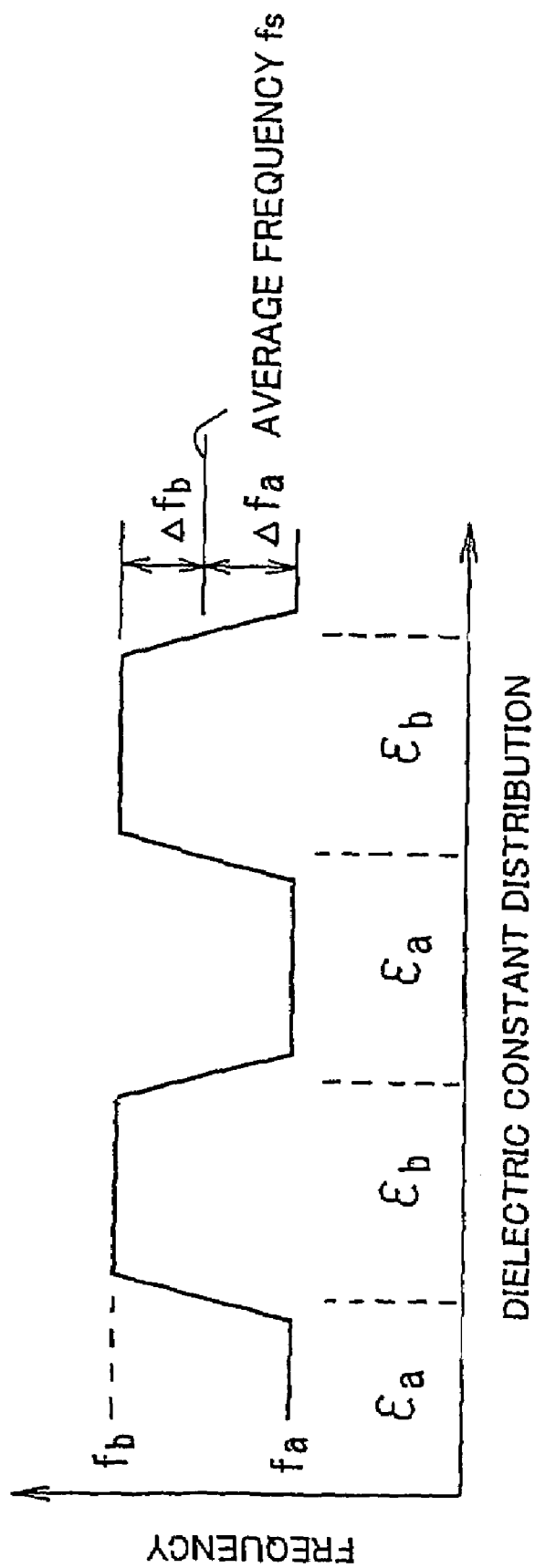
FIG. 4 is a view showing a measurement result of a standard sample of a dielectric constant change.
Figure 5:
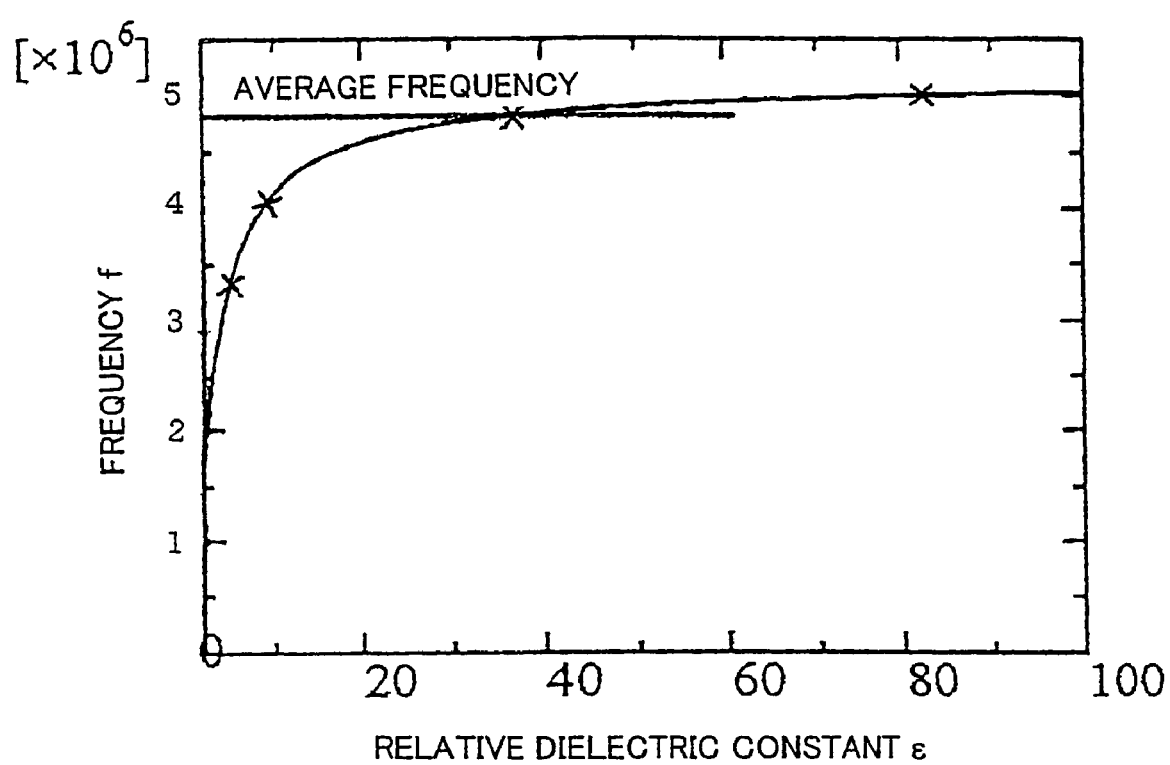
FIG. 5 is a view showing a working curve based on a plurality of standard samples, with regard to the change in the capacitance and the change in the resonance frequency.

At first, a dielectric constant measuring apparatus in a first embodiment will be described below with reference to FIGS. 1 to 5. Here, FIG. 1 is a view showing the configuration of a model of a cantilever, various capacitances and a detection of a dielectric constant, FIGS. 2A to 2C are views showing a trace and a contact property with a dielectric substance of the cantilever, FIGS. 3A to 3C are views illustrating a relation between a change in a capacitance and a change in a resonance frequency, FIG. 4 is a view showing a measurement result of a standard sample of the dielectric constant change, and FIG. 5 is a view showing a working curve based on a plurality of standard samples, with regard to the change in the capacitance and the change in the resonance frequency.

Figure 1:
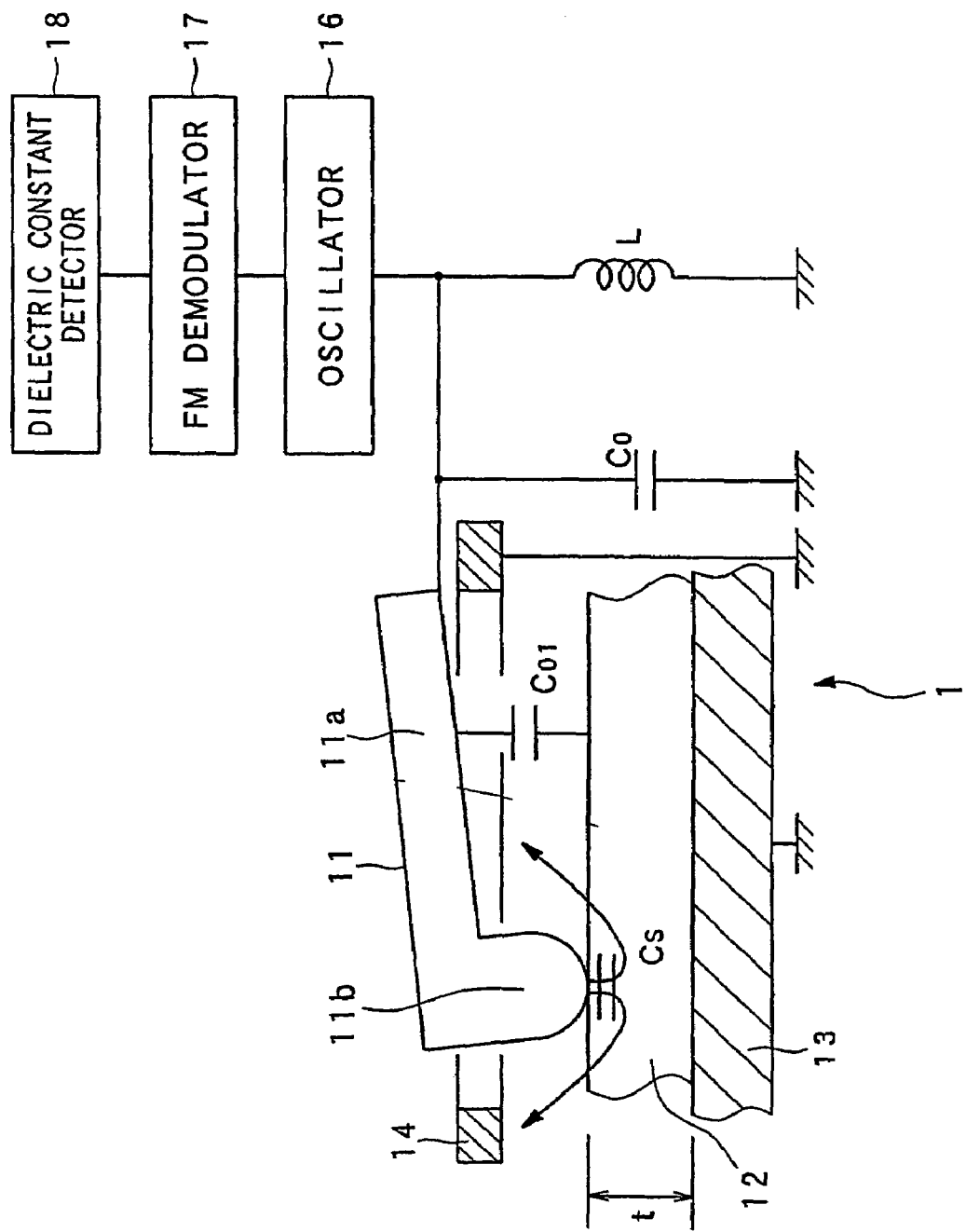
FIG. 1 is a view showing a configuration of a model of a cantilever, various capacitances and a detection of a dielectric constant in an embodiment of the present invention.

As shown in FIG. 1, the configuration of a dielectric constant measuring apparatus 1 is provided with a cantilever 11, an electrode 14, an oscillator 16, an FM demodulator 17 and a dielectric constant detector 18. Moreover, an inductor L is placed for constituting a resonance circuit together with all capacitances containing a capacitance Cs of a dielectric constant measurement portion of a dielectric substance 12.

The operations and the actions of the respective components will be described below.

The cantilever 11 is used to measure a dielectric constant of the dielectric substance 12, and composed of a cantilever portion 11a made of a conductive member and a projection 11b placed at a tip side of the cantilever portion 11a. The projection 11b is brought into contact with the dielectric constant measurement portion of the dielectric substance 12, and an electric field of a high frequency from the oscillator 16 is applied to a measured small area of the dielectric substance 12. The dielectric substance 12 is placed on a stage 13.

The electrode 14 is the electrode placed around the cantilever 11, and it is grounded. This electrode 14 is placed such that an oscillation signal from the oscillator 16, which will be described later, is sent to the cantilever 11, and the electric field of the high frequency is passed through a capacitance in the small area of the dielectric substance 12, and returned back to the grounded side. In a case of the electrode carrying out the similar function, its shape does not matter.

The oscillator 16 is the oscillator for oscillating at a frequency corresponding to a capacitance Cs in the small area of the dielectric substance 12. More concretely, the resonance circuit is constituted by a capacitance in relation to the resonation of the circuit containing the capacitance Cs immediately under the projection 11b of the cantilever 11 and the inductor L, and the oscillator 16 oscillates at the frequency corresponding to the resonation frequency of this resonance circuit. This frequency is about 1 GHz on average. Although it will be described later in detail, the capacitance Cs of the small area is closely related with the dielectric constant of the dielectric substance. Then, the change in this capacitance Cs is separated from other capacitances and extracted as a change amount of the oscillation frequency.

Also, in order to improve the measurement accuracy, it is desired to make the oscillation frequency of the oscillator 16 higher. In this case, the constant of the resonance circuit needs to be selected correspondingly to it.

The FM demodulator 17 is intended to demodulate an oscillation output of the oscillator 16, and it demodulates a frequency modulation corresponding to the change in the capacitance Cs into an AM signal. A general FM detecting circuit may be used as the FM demodulator 17.

The dielectric constant detector 18 has a circuit for carrying out a signal process and an operation process to detect a dielectric constant from the signal demodulated by the FM demodulator 17. Also, the circuit for the operation process performs a predetermined operation on an obtained information and a process such as a data proofread and the like, and the dielectric constant is determined.

The merit of the operational performance in a usage of a probe of a cantilever type will be described below. FIG. 2A shows the positional relation between a fixing member 19 of the cantilever 11 and the dielectric substance 12 at an original setting state. In this state, the distance between the fixing member 19 and the dielectric substance 12 is kept at d1, as shown in FIG. 2A. The setting of the position of the fixing member 19 is done by using a predetermined vertical direction positioning apparatus (not shown). The base of the cantilever 11 is fixed to the fixing member 19 such that the cantilever portion 11a slightly bends in the original setting state. In this state, as the cantilever portion 11a has elasticity, the projection 11b is brought into contact with the dielectric substance 12 at a moderate contact pressure.

FIG. 2B shows the condition that the surface of the dielectric substance 12 is concave by d2, and a distance from the head side fixing member 19 is d1+d2. The SNDM can observe the condition of the surface at a sub nm order. Thus, on the contrary, it is inevitable that the concave and convex condition at an atomic level has an influence on the operation. On the other hand, it is inevitable that the surface of the dielectric substance 12 has the concave and convex condition at the atomic level. Also, it is necessary to consider a change in a thickness direction caused by a temperature. In such condition, even if the concave portion exists in the surface, the moderate contact pressure can be kept by the elasticity of the cantilever portion 11a, although the degree of the bend of the cantilever portion 11a is slightly loosened. Hence, the projection 11b can be brought into contact with this surface in an optimum state.

On the other hand, FIG. 2C shows the condition that the surface of the dielectric substance 12 becomes convex by d3, and the distance from the head side fixing member 19 becomes d1–d3. In this case, the degree of the bend of the cantilever portion 11a is slightly increased, and the contact pressure of the projection 11b is increased. However, the moderate contact performance is held.

The projection 11b that is the tip of the probe of the cantilever 11 is super finely machined at a curvature of an nm order. Thus, it is possible to attain the resolution of the nm order.

Due to the employment of the cantilever type as the probe as mentioned above, it is not necessary to adjust a height direction of the probe on each occasion, for the slight concave and convex condition on the surface of the dielectric substance 12. Thus, the operational performance, the tracking performance and the trace ability are extremely improved. At the same time, since the tip of the probe of the cantilever type is super finely machined as mentioned above, the surface of the dielectric substance 12 can be explored at a high resolution. This merit is extremely evident when the technique is applied to an information recording/reproducing apparatus which will be described later. It is possible to continuously carry out the recording/reproducing operation for a long time. The conventional probe of a vertically standing probe type requires a predetermined adjusting operation in order to cope with the concave and convex condition on the surface of the dielectric substance 12, and it requires the mechanism for it.

The quantitative measurement of the dielectric constant will be described below with reference to FIGS. 3A, 3B, 3C, and FIGS. 4, 5.

The probe used in this embodiment is the cantilever type. As shown in FIG. 1, let us suppose that a capacitance of a dielectric substance immediately under the tip 11$b$ is Cs, a capacitance between the cantilever 11 and the dielectric substance 12 is $C_{01}$, and a floating capacitance of the apparatus is $C_0$. The capacitances $C_{01}$, $C_0$ are the amounts determined by the configuration type of the apparatus, and the capacitance Cs is determined by the dielectric constant of the dielectric substance. Also, the capacitances $C_{01}$, $C_0$ and the capacitance Cs are positioned in parallel from the mechanism configuration.

Let us consider the resonation frequency in the relation with the inductor L mounted in an external portion under the above-mentioned condition. In FIG. 3A, the tip of the cantilever 11 is assumed to be a sphere of a radius a. Then, the tip is separated from the dielectric substance 12. Thus, the capacitance Cs does not contribute to the resonation frequency. Under this condition, the resonance circuit is constituted by the inductor L and the capacitance $C_0$. Its frequency $f_0$ is given by:

$$f_0 = 1/2\pi\sqrt{(LC_0)} \tag{1}$$

Next, as shown in FIG. 3B, let us suppose that the cantilever 11 is brought into contact with the dielectric substance 12, and the capacitances $C_{01}$ and the capacitance Cs are added in parallel to the capacitances $C_0$ of the resonance circuit. Although the synthesized capacitance is $C=C_0+C_{01}+Cs$, Cs is sufficiently smaller than $C_{01}$ (about 1:1000). Thus, it is approximately assumed that $C=C_0+C_{01}$. At this time, the resonation frequency $f_s$ is given by:

$$f_s = 1/2\pi\sqrt{\{L(C_0+C_{01})\}} \tag{2}$$

Hence, the equation (3) and the equation (4) are generated from the equation (1) and the equation (2) as follows:

$$f_0/f_s = \sqrt{\{(C_0+C_{01})/C_0\}} \tag{3}$$

$$1/(C_0+C_{01}) = (f_s/f_0)^2/C_0 \tag{4}$$

Next, let us suppose that since the cantilever 11 is moved, the capacitance Cs immediately under the cantilever 11 becomes Cs+ΔCs, and the oscillation frequency becomes $f_s+\Delta f_s$. At this time, $\Delta f_s$ is given by:

$$\Delta f_s = -f_s \Delta Cs/2\{C_0+C_{01}\} \tag{5}$$

This is given by the equation (6). That is, it is given by:

$$f_s + \Delta f_s = 1/2\pi\sqrt{\{L(C_0+C_{01}+Cs+\Delta Cs)\}} \tag{6}$$

$$\approx 1/2\pi\sqrt{\{L(C_0+C_{01}+\Delta Cs)\}}$$

Moreover, from Tayler's expansion, it is given by:

$$= [1-\Delta Cs/\{2(C_0+C_{01})\}]/2\pi\sqrt{\{L(C_0+C_{01})\}}$$

On the other hand, the capacitance change ΔCs is given by the equation (7):

$$\Delta Cs = 4\pi\varepsilon_0 a\{1/\{b(1-b)\} - \ln\{1/(1-b)\}/b^2\}[2\Delta\varepsilon/(\varepsilon_r+1)^2] \tag{7}$$

$$= 4\pi\varepsilon_0 a \times 2K\Delta\varepsilon$$

However, $$K = [1/\{b(1-b)\} - \ln\{1/(1-b)\}/b^2][2/(\varepsilon_r+1)^2] \tag{8}$$

$$b = (\varepsilon_r-1)/(\varepsilon_r+1) \tag{9}$$

Also, $\varepsilon_r$ is an average relative dielectric constant of the dielectric substance 12, and Δε is $\Delta\varepsilon=\varepsilon_r-\varepsilon_a$ when the relative dielectric constant immediately under of the cantilever 11 becomes $\varepsilon_a$. Incidentally, the introduction of the equation (7) is known, and the explanation is omitted at this time.

Thus, from the equations (5), (6), (7) and (8), the frequency change $\Delta f_s$ is given by:

$$\Delta f_s = -f_s \Delta Cs/\{2(C_0+C_{01})\} \tag{10}$$

$$= -f_s \times 4\pi\varepsilon_0 a \times 2K\Delta\varepsilon/\{2(C_0+C_{01})\}$$

$$= -4\pi\varepsilon_0 f_s K\Delta\varepsilon\{a/(C_0+C_{01})\}$$

$$= -4\pi\varepsilon_0(a/C_0)(f_s^3/f_0^2)K\Delta\varepsilon$$

In the equation (10), K is known by measuring the average relative dielectric constant $\varepsilon_r$ of a known dielectric substance. Thus, if $\Delta f_s$ and Δε are known, $a/C_0$ (referred to as a probe constant) can be determined. That is, if $a/C_0$ can be determined, $\Delta f_s$ can be measured to thereby determine Δε.

The determination of $\varepsilon f_s$ and Δε will be described below. Let us suppose that the dielectric constant of the dielectric substance 12 is known. Namely, let us suppose that the relative dielectric constants $\varepsilon_a$ and $\varepsilon_b$ are alternately distributed in a range including the portion where the cantilever 11 and a holding member which holds the cantilever 11 (not shown) face the dielectric substance 12, as shown in FIG. 3B. The relative dielectric constants $\varepsilon_a$ and $\varepsilon_b$ form the capacitance $C_{01}$. Moreover, assuming that the oscillation frequencies obtained when the sample is used to excite an oscillation are fa, fb. Moreover, let us suppose that if the average relative dielectric constant is $\varepsilon_r$, the frequency is fs, and when the frequency $f_s$ becomes $f_b(=f_s+\Delta f_b)$, $\varepsilon_r$ is $\varepsilon_b$ ($=f_s+\Delta f_b$), and when the frequency fs fs becomes $f_a(=f_s+\Delta f_a)$, $\varepsilon_r$ is $\varepsilon_a$. Hence, $\Delta f_s=\Delta f_b$ and $\Delta\varepsilon=\varepsilon_b-\varepsilon_r$. As a result, only the $a/C_0$ is a unknown item peculiar to the apparatus, in the equation (10). However, this can be determined by using the sample whose dielectric constant is already known, as the probe constant as mentioned above.

Next, let us suppose that the dielectric substance 12 is measured by using this measuring apparatus as shown in FIG. 3C. Let us suppose that relative dielectric constants $\varepsilon_a'$ and $\varepsilon_b'$ are aligned, and an average relative dielectric constant at the measurement condition is $\varepsilon_r'$. The method of determining this average relative dielectric constant $\varepsilon_r'$ will be described later in detail with reference to FIG. 5. Let us suppose that at this time, a total capacitances $C'=C_0+C_{01}'+Cs' \approx C'=C_0+C_{01}'$. Then, an oscillation frequency $f_s'$ is given by the equation (11):

$$f_s = 1/2\pi\sqrt{(LC')}$$
$$= 1/2\pi\sqrt{\{L(C_0 + C_{01}')\}} \quad (11)$$

Thus, similarly to the equation (4):

$$1/(C_0+C_{01}')=(f_s'/f_0)^2/C_0 \quad (12)$$

Similarly, a frequency change $\Delta f_s'$ is represented by the equation (13), and a capacitance change $\Delta Cs'$ immediately under the cantilever 11 is represented by the equation (14):

$$\Delta f_s' = -f_s' \Delta Cs' / \{2(C_0 + C_{01}')\} \quad (14)$$
$$\Delta Cs' = 4\pi\varepsilon_0 a [1/\{b'(1-b')\} - \ln\{1/(1-b')\}/b'^2][2\Delta\varepsilon'/(\varepsilon_r'+1)^2]$$
$$= 4\pi\varepsilon_0 a \times 2K' \Delta\varepsilon'$$

However, $$K' = [1/\{b'(1-b')\} - \ln\{1/(1-b')\}/b'^2][2/(\varepsilon_r'+1)^2] \quad (15)$$
$$b' = (\varepsilon_r' - 1)/(\varepsilon_r' + 1) \quad (16)$$

Thus, from the equations 13, 14 and 15, the frequency change $\Delta f_s'$ is given by:

$$\Delta f_s = -f_s' \Delta Cs' / \{2(C_0 + C_{01}')\} \quad (17)$$
$$= f_s' \times 4\pi\varepsilon_0 a \times 2K' \Delta\varepsilon' / \{2(C_0 + C_{01}')\}$$
$$= -4\pi\varepsilon_0 f_s K' \Delta\varepsilon' \{a/(C_0 + C_{01}')\}$$
$$= -4\pi\varepsilon_0 (a/C_0)(f_s'^3/f_0^2) K' \Delta\varepsilon'$$

Thus, the probe constant $a/C_0$ can be known from the test of the known sample as mentioned above, and $f_0$, $f_s'$ and $K'$, namely, $b'$ can be obtained from the measurement. Hence, if the frequency change $f_s'$ can be known, the relative dielectric constant change $\Delta\epsilon'$ can be known. Here, the actual relative dielectric constant immediately under the cantilever 11 is $\epsilon_r'+\Delta\epsilon'$.

FIG. 5 shows an example of a relation between a shift of a frequency and a relative dielectric constant of a dielectric substance, on the basis of an actual measurement result of the standard samples. This example indicates a theoretic curve obtained as one working curve when a plurality of standard samples are LiTaO$_3$, LiNbO$_3$, BaTiO$_3$ and sapphire and the like. In FIG. 5, when the LiTaO$_3$ having a cyclic polarization inversion structure is measured as a sample having a dielectric constant distribution, a position of the average ($f_s$) frequency as shown in FIG. 4 corresponds to a relative dielectric constant of 36.3. Also, points corresponding to the plurality of standard samples defining the working curve are noted on the working curve with X marks. If the working curve in the peculiar measurement system including the cantilever 11 and the like is determined in advance as mentioned above, a linear dielectric constant can be measured as a quantitative amount by using the above-mentioned method. That is, if the frequency shift in the measurement of the sample targeted for the measurement is known in the peculiar measurement system in which the theoretic curve is known in advance as the working curve, the relative dielectric constant $\epsilon_r$ can be easily determined by putting on this theoretic curve. Incidentally, the above-mentioned working curve is not based on a thickness of the standard sample, if the thickness of the standard sample is sufficiently thick as compared with a depth of the small area to which the electric field is applied at the tip of the cantilever 11 (for example, if the thickness is about 50 100 μm or more). Moreover, as for the sample targeted for the measurement, if it has the above-mentioned thickness, the relative dielectric constant $\epsilon_r$ can be determined at a relatively high accuracy.

First Modification

Figure 6:
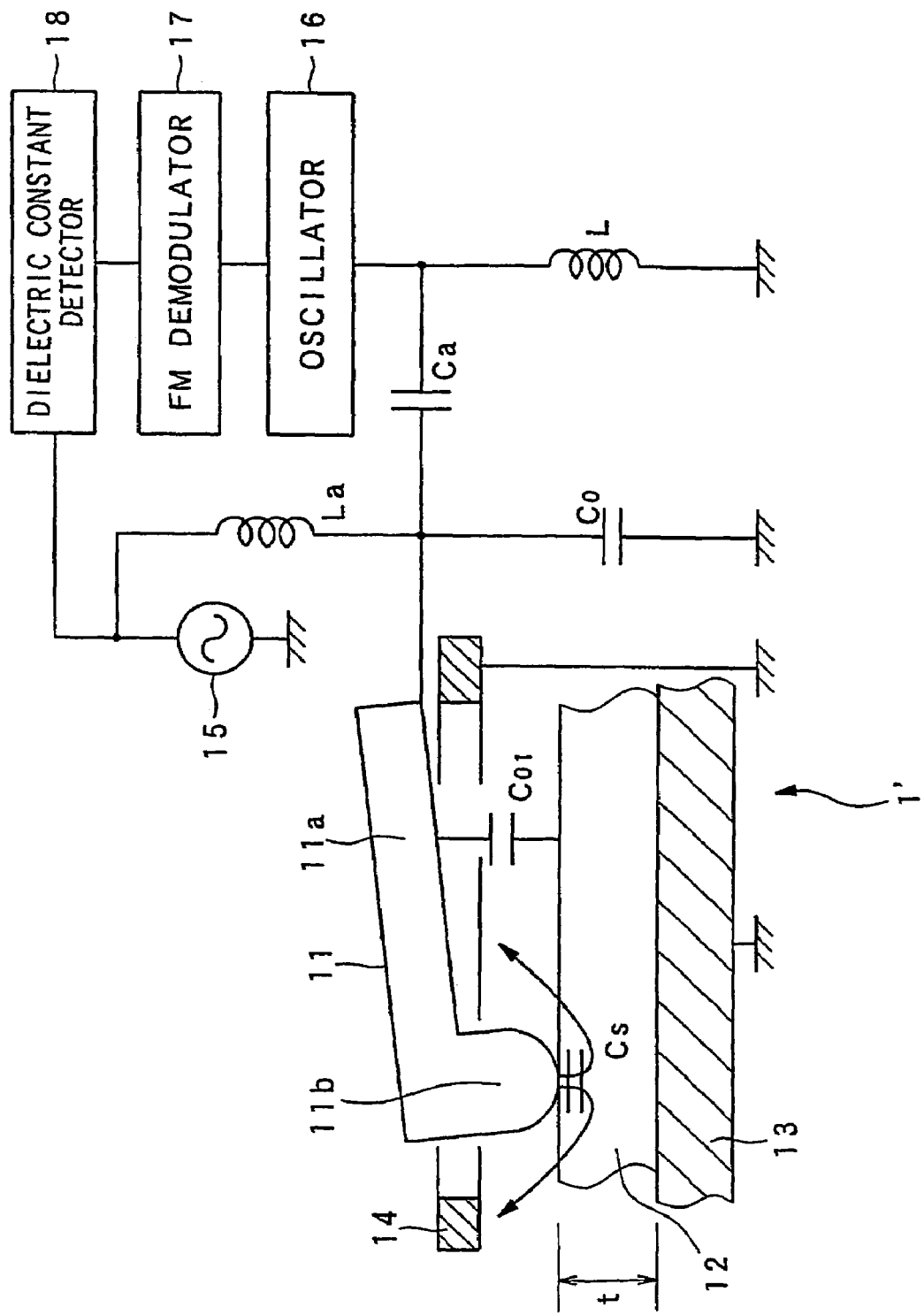
FIG. 6 is a view showing a configuration of a model of a cantilever, various capacitances and a detection of dielectric constant in a first variation.
Figure 7:
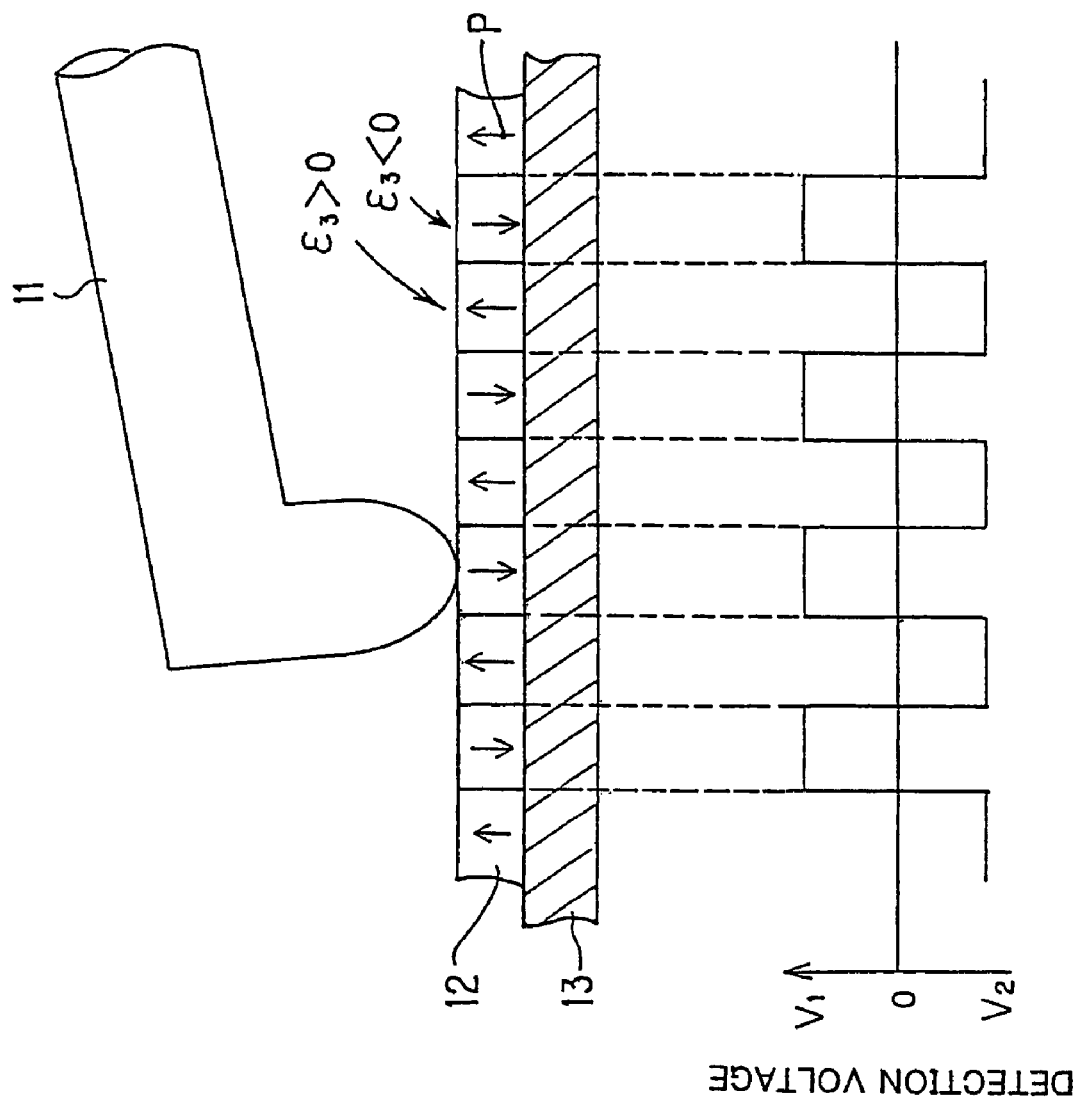
FIG. 7 is a view illustrating a relation between a polarization state of the dielectric substance and an output voltage in the first variation.

The first modification of the first embodiment will be described below with reference to FIG. 6 and FIG. 7. FIG. 6 is a view showing the configuration of a model of a cantilever, various capacitances and a detection of a dielectric constant, and FIG. 7 is a view illustrating a relation between a polarization state of the dielectric substance and an output voltage. Also, the similar reference symbols are given to the members similar to those shown in FIG. 1, and their explanations are suitably omitted.

In the first modification, information can be reproduced or recorded, or recorded and reproduced by changing the polarization state of the small area of the dielectric substance, in the first embodiment. In particular, this is intended to be applied to the basic structure of a dielectric recording/reproducing apparatus for recording the information at a high density, by using the cantilever having the above-mentioned features as a pickup device. The actual configuration and operation of the apparatus using the basic structure of this information recording/reproducing apparatus will be described below as the second and third modifications and the second and third embodiments. Here, in particular, the basic principle of the detection of the dielectric constant in the first variation is substantially similar to the case of the first embodiment.

That is, as shown in FIG. 6, an information recording/reproducing apparatus 1' is provided with the cantilever 11, the electrode 14, an alternating signal generator 15, the oscillator 16, the FM demodulator 17 and the dielectric constant detector 18. Moreover, it is provided with: a low cut filter composed of a capacitance Ca and an inductor La for protecting a signal of the alternating signal generator 15 from interfering with the oscillator 16; and an inductor L together with a total capacitance including a capacitance Cs of a dielectric constant measurement portion of the dielectric substance 12 constituting a resonance circuit.

The operation and the action of each of the members will be described below.

The alternating signal generator 15 generates a low frequency signal to be sent through the inductor La to the cantilever 11. This signal is an alternating signal having a frequency of about 5 KHz, and it is applied to the small area of the dielectric substance 12 as an alternating electric field from the projection 11b. Also, the low cut filter constituted by the inductor La and the capacitance Ca protects the alternating signal of the alternating signal generator 15 from being sent to the oscillator 16 and interfering with it. That cut-off frequency is $f=1/2\pi\sqrt{(LaCa)}$. A frequency of the alternating signal of the alternating signal generator 15 is about 5 Khz, and an oscillation frequency of the oscillator 16 is about 1 Ghz. Thus, the separation can be sufficiently done by a first LC filter. Although a filter having a higher degree may be used, the number of elements becomes greater, which may result in a fear that the size of the apparatus is large. Here, as for the influence on the oscillation of a capacitance Ca inserted for the low cut filter, the capacitance Cs, the floating capacitance $C_0$ and the like are sufficiently small as compared with the capacitance Ca. Moreover, they are connected in series. Hence, the influence of the capacitance Ca can be ignored.

Also, in order to improve the measurement accuracy, it is desired to make the oscillation frequencies of the alternating signal generator 15 and the oscillator 16 much higher. In this case, the constant of the filter needs to be selected correspondingly to it.

The dielectric constant detector 18 has a circuit for carrying out a signal process and an operation process to detect a dielectric constant from a signal demodulated by the FM demodulator 17. The information with regard to a dielectric constant of a high quality is extracted by receiving the alternating current of the alternating signal generator 15, referring to this signal for the demodulation signal, and then carrying out a synchronous detection. For example, a lock-in amplifier is used as this synchronous detection. The configuration and the operation of the lock-in amplifier will be described later in detail. Incidentally, another phase detector may be naturally used. Also, in the circuit of the operation process, the dielectric constant is determined by performing a predetermined operation, and a process such as a data proofread and the like, on the obtained information.

The polarization state of the dielectric substance and a detection voltage will be described below with reference to FIG. 7.

As shown in FIG. 7, let us suppose that the polarization of the small area for the measurement of the dielectric substance 12 is in a direction indicated by arrows P. A plus or minus of a third dielectric constant $\epsilon_3$ is determined from a relation between a direction of the alternating electric field applied from the cantilever 11 and the P-direction of the polarization of the corresponding small area. Thus, values of capacitances Csa to Csn corresponding to them are changed. Although this will be described later in detail, in the oscillator 16, the oscillation frequency is changed on the basis of the values of the capacitances Csa to Csn. The information of the dielectric constant can be read out by demodulating and detecting it.

In the first variation shown in FIG. 6, preferably, a plurality of cantilevers 11 are used to record or reproduce the information at the same time. At this time, a plurality of alternating signal generators 15 and a plurality of inductors La may be disposed in the information recording/reproducing apparatus, and a plurality of peculiar different alternating voltages may be supplied to the cantilevers 11 through inductors La, respectively. By this construction, the signal to be detected through the each cantilever can be discriminated by using the frequency of each alternating current signal as a reference signal. The frequencies of the alternating current signals are about 5 Khz on average. The alternating electric field is applied to each small area of the dielectric thin film 12 between each cantilever 11 and the stage 13.

Thus, when the pure recording operation that does not involve the reproduction of the record information for checking whether or not the recording state is normally done while the recording is carried out is carried out, it is not necessary to apply the alternating electric field for discriminating the signals detected by the respective cantilevers 11 as mentioned above. Then, the application of the alternating electric field is done only for the signal reproduction. For this reason, at the time of the recording, a direct current voltage or a pulse may be applied to the respective cantilevers 11, respectively. On the other hand, at the time of the reproduction, for example, the alternating current signals that are sufficiently lower than a carrier frequency and are different in frequency correspondingly to the number of the cantilevers 11 may be applied from the respective alternating signal generators 15. Then, whether or not the alternating electric field is applied by each alternating signal generator 15 as mentioned above may be switched by using a switch at the times of the recording and the reproducing.

Second Modification

Figure 8:
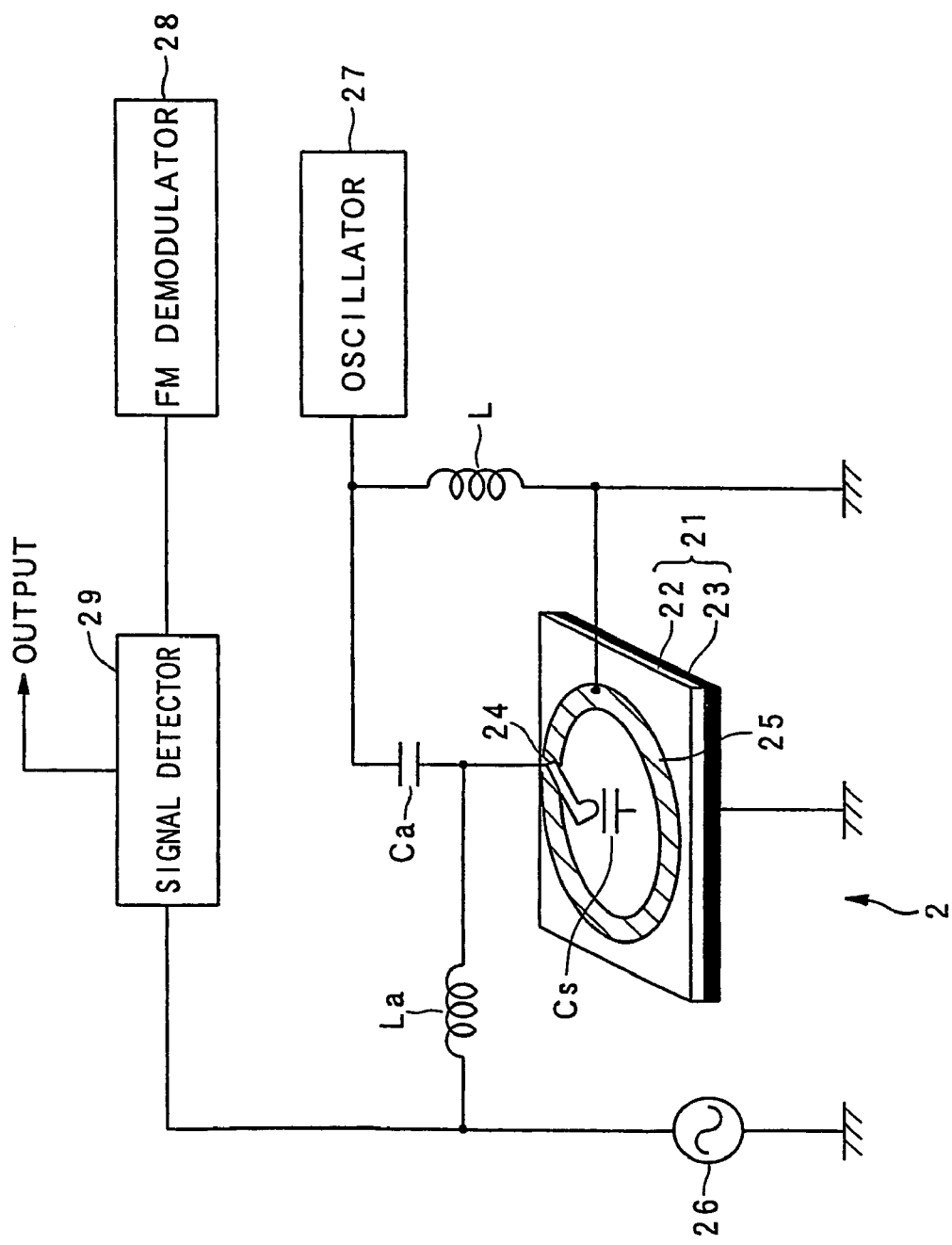
FIG. 8 is a view showing a mechanism for detecting a dielectric constant by applying to a cantilever an alternating current in a second embodiment.

An information reproducing apparatus 2 to which the above-mentioned dielectric constant measuring technique using the cantilever is applied will be described below with reference to FIG. 8. The information is recorded in the small area of a dielectric substance at high density as the change of the polarization state of the small area. The information reproducing apparatus 2 can reproduces the recorded information by using the cantilever having the above-mentioned features as the pick-up device.

The information reproducing apparatus is provided with a dielectric substance recording medium 21 composed of a dielectric substance 22 and a substrate 23, a cantilever 24, an electrode 25, an alternating current signal generator 26, an oscillator 27, an FM demodulator 28, a signal detector 29, an inductor L, an inductor La and a capacitance Ca. Here, the above-mentioned floating capacitance and the like are assumed to be determined by using a predetermined manner, and they are not introduced in the following explanation.

The polarization state is determined correspondingly to the recorded information in the small area on the surface of the dielectric substance 22 of the dielectric substance recording medium 21, and thus, the capacitance Cs is determined correspondingly to the polarization state. A resonance circuit is constituted with the inductor L and the capacitance Cs of the small area, which the cantilever 24 is brought into contact with. Then, the oscillator 27 is oscillated on the basis of that resonation frequency. Although the capacitance Ca is inserted in series into the oscillating circuit, it is extremely large as compared with the Cs. Thus, the capacitance Cs is the main element of the resonation frequency.

The electrode 25 is an electrode for returning the high frequency electric field back to a ground when a high frequency signal oscillated by the oscillator 27 is applied to the cantilever 24 and further applied to the small area of the dielectric substance 22.

The alternating current signal generator 26 generates the alternating current signal to be applied to the cantilever 24, and applies the alternating electric field to the small area of the dielectric substance 22. The difference of the dielectric constant, namely, the difference of the capacitance Cs corresponding to it is detected from a direction of this alternating electric field and a direction of the polarization. Consequently, an oscillation frequency of the oscillator 27 is modulated.

The inductor La and the capacitance Ca constitutes the low cut filter placed in order to protect the alternating current signal of the alternating current signal generator 26 from leaking into and interfering with the oscillator 27. The oscillation frequency of the oscillator 27 is about 1 GHz, and a frequency of the alternating current signal of the alternating current signal generator 26 is about 5 KHz. Thus, the separation can be sufficiently done through the first LC filter.

The FM demodulator 28 demodulates the frequency-modulated oscillation signal of the oscillator 27. This uses the typical FM detector. The signal detector 29 carries out the synchronous detection by using the alternating current signal of the alternating current signal generator 26 as the synchronous signal, from the signal demodulated by the FM demodulator 28, and reproduces the recorded information.

A plurality of cantilevers 24 may be used. In this case, a plurality of peculiar individual alternating current signals are applied to the cantilevers 24, respectively, and they are used to discriminate information.

As described above, the information reproducing apparatus of the high density can be configured by applying the technique of the dielectric constant measuring apparatus that uses the cantilever as the probe electrode.

Third Modification

Figure 9:
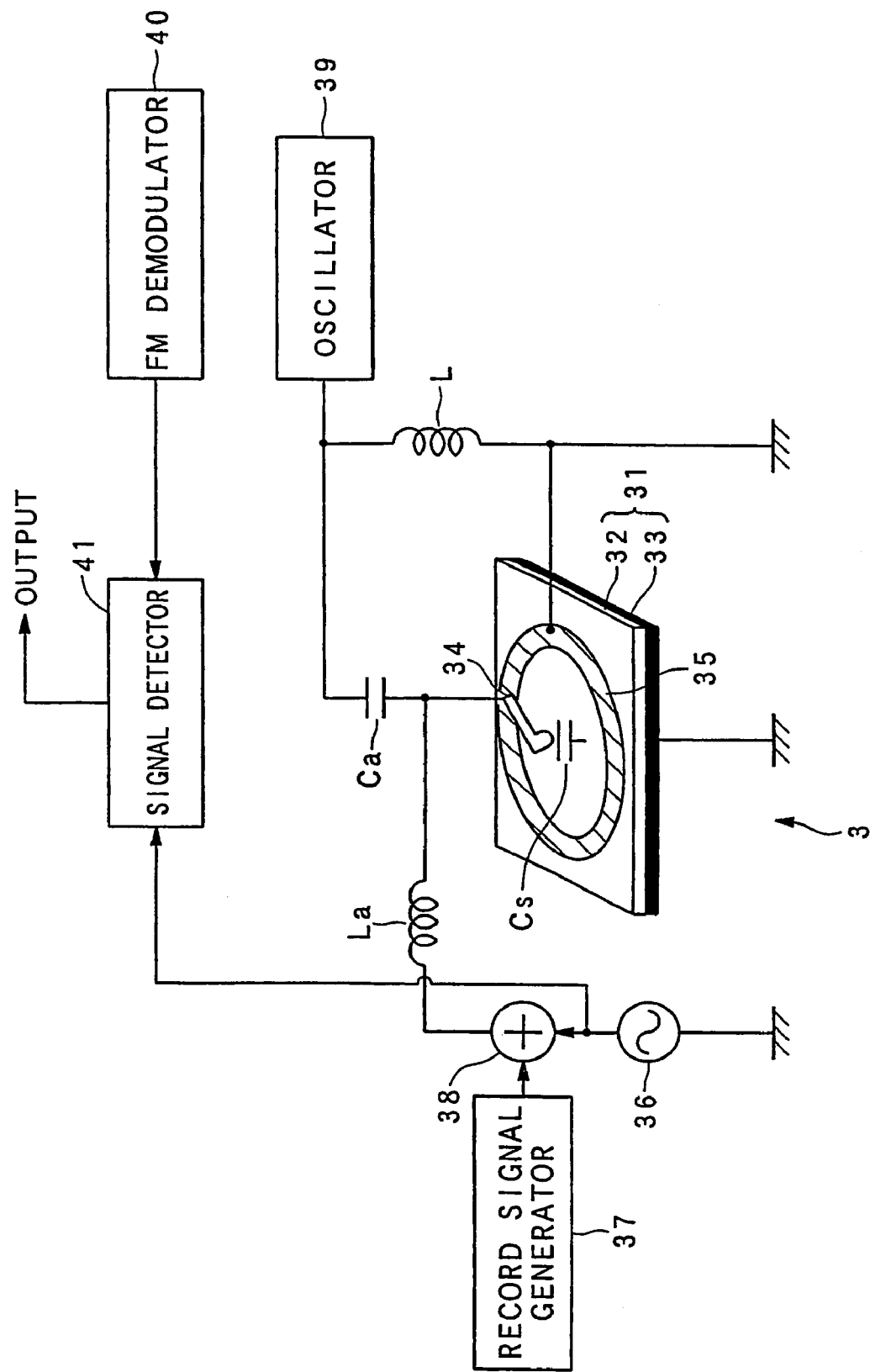
FIG. 9 is a view showing a configuration for changing a polarization in a small area of a dielectric substance by using a record signal and an alternating signal in a third variation.

An information recording apparatus to which the above-mentioned dielectric constant measuring technique using the cantilever is applied will be described below with reference to FIG. 9. It is possible to change the polarization state of the small area of the dielectric substance to thereby record information, and it is possible to record the information at a high density by using the cantilever having the above-mentioned features as the pick-up device.

The information recording apparatus 3 is provided with a dielectric substance recording medium 31 composed of a dielectric substance 32 and a substrate 33, a cantilever 34, an electrode 35, an alternating current signal generator 36, an alternating current signal generating device 36, a record signal generator 37, an adder 38, an oscillator 39, an FM demodulator 40, a signal detector 41, an inductor L, an inductor La and a capacitance Ca.

The polarization state is determined correspondingly to the information recorded in the small area on the surface of the dielectric substance 32 of the dielectric substance recording medium 31, and there is a capacitance Cs corresponding to it. A resonance circuit is constituted with the inductor L and the capacitance Cs of the small area, which the cantilever 34 is brought into contact with. Then, the oscillator 39 is oscillated on the basis of that resonation frequency. Although the capacitance Ca is inserted in series into the oscillating circuit, it is extremely large as compared with the Cs. Thus, the capacitance Cs is the main element of the resonation frequency, as described above.

The electrode 35 is an electrode for returning the high frequency electric field back to a ground when a high frequency signal oscillated by the oscillator 37 is applied to the cantilever 34 and further applied to the small area of the dielectric substance 32.

An alternating current signal generator 36 generates an alternating current signal to be applied to a cantilever 34, applies an alternating electric field to a small area of a dielectric substance 32, biases a record signal from a record signal generator 34, and controls a polarization state, and then records information. It is possible to monitor whether or not the normal recording operation is carried out, by modulating an oscillation frequency of an oscillator 39 on the basis of a difference of a capacitance Cs corresponding to the polarization state, and then demodulating it.

An inductor La and a capacitance Ca constitutes a low cut filter placed in order to protect the alternating current signal of the alternating current signal generator 36 from leaking into and interfering with the oscillator 39. An oscillation frequency of the oscillator 39 is about 1 GHz, and a frequency of the alternating current signal of the alternating current signal generator 36 is about 5 KHz. Thus, the separation can be sufficiently done through the first LC filter. The trial of making the frequency higher is advantage in a data transfer rate. In this case, a filter constant suitable for it may be selected.

The FM demodulator 40 demodulates the oscillation signal of the oscillator 39 on which the frequency modulation is performed. This uses the typical FM detector. The signal detector 41 carries out the synchronous detection by using the alternating current signal of the alternating current signal generator 36 as the synchronous signal, from the signal demodulated by the FM demodulator 40, and reproduces the recorded information.

A plurality of cantilevers 34 may be used. In this case, a plurality of peculiar individual alternating current signals are applied to the cantilevers 24, respectively, and they are used to discriminate information.

As described above, the information recording apparatus of the high density can be configured by applying the technique of the dielectric constant measuring apparatus that uses the cantilever as the probe electrode.

The lock-in amplifier used for the synchronous detection in the dielectric constant detector or the signal detectors (18, 29, 41) will be described below with reference to FIG. 10. Incidentally, the device used for the synchronous detection is not limited to this lock-in amplifier, as mentioned above.

Figure 10:
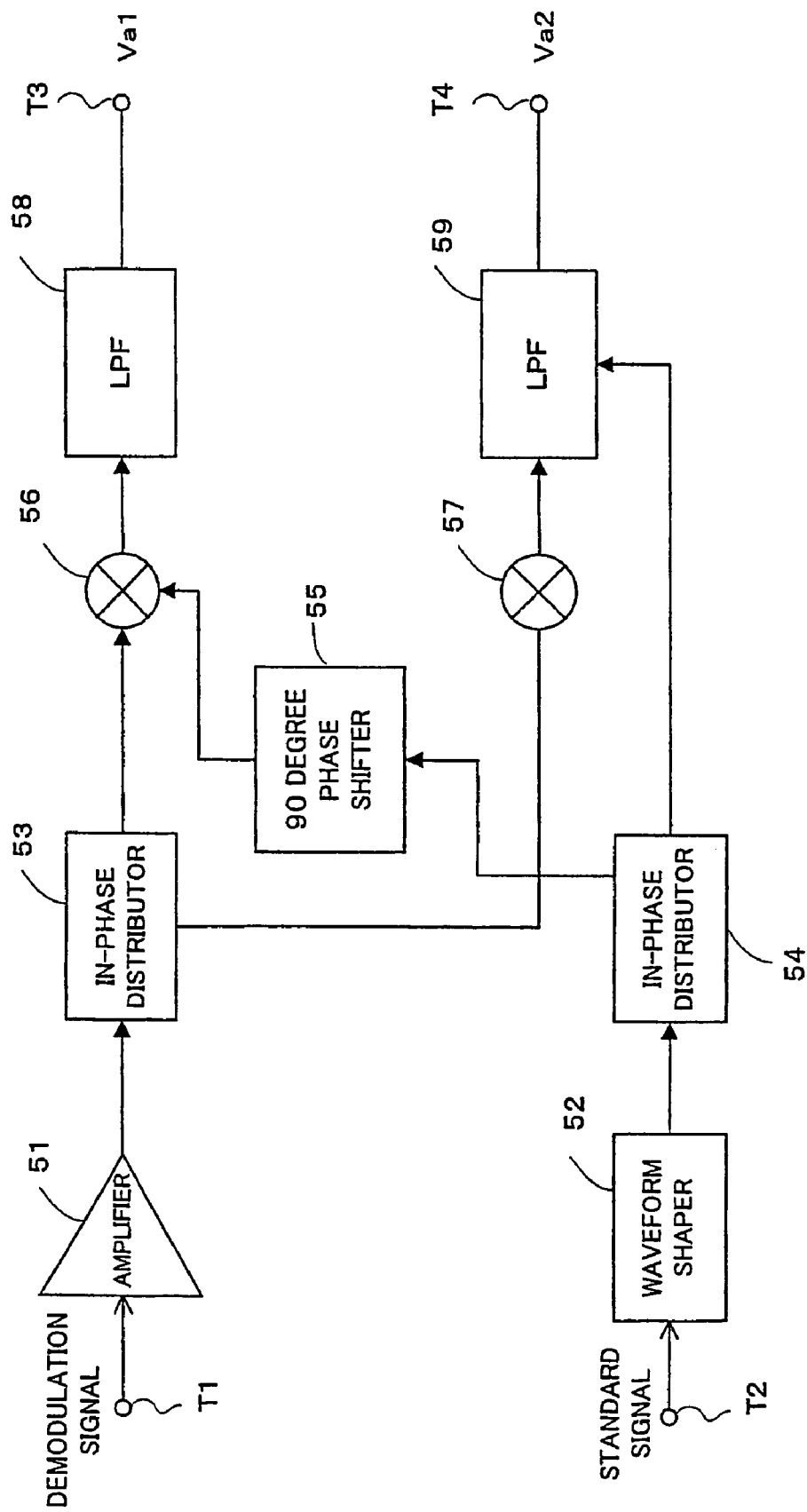
FIG. 10 is a view illustrating an operation for detecting a signal and a configuration of a lock-in amplifier used in detecting a signal.

As shown in FIG. 10, a lock-in amplifier 5 is provided with input terminals T1, T2, an amplifier 51, a waveform shaper 52, in-phase distributors 53, 54, a 90 degree phase shifter 55, mixers 56, 57 serving as multipliers, low-pass filters 58, 59 and output terminals T3, T4.

The amplifier 51 amplifies a demodulation signal inputted through the input terminal T1 and outputs it to the in-phase distributor 53. The in-phase distributor 53 distributes the amplified demodulation signal at the in-phase and outputs it to the mixers 56, 57. On the other hand, the waveform shaper 52 converts the shape of a reference signal (i.e. the alternating current signal of FIG. 1) inputted through the input terminal T2 into a rectangular wave, and outputs it to the in-phase distributor 54. The in-phase distributor 54 distributes the reference signal outputted from the waveform shaper 52 at the in-phase, and outputs it to the mixer 57 and the 90 degree phase shifter 55. The 90 degree phase shifter 55 shifts the reference signal by 90 degree at the frequency of the reference signal, and outputs it to the mixer 56. The mixer 56 multiplies and mixes the demodulation signal and the reference signal shifted by 90 degree, and converts into a signal having frequencies of a sum and a difference between the frequency of the demodulation signal and the frequency of the reference signal, and outputs it to the low-pass filter 58. The low-pass filter 58 passes only a direct current signal among the input signals after the mixing, and outputs an output voltage Va1 to the output terminal T3. The mixer 57 multiplies and mixes the demodulation signal and the reference signal, and converts into the signal having the frequencies of the sum and the difference between the frequency of the demodulation signal and the frequency of the reference signal, and outputs it to the low-pass filter 59. The low-pass filter 59 passes only the direct current signal among the input signals after the mixing, and outputs an output voltage Va2 to the output terminal T4.

Assuming that a phase difference between the demodulation signal inputted to the input terminal T1 and the reference signal inputted to the input terminal T2 is $\phi$, and that an absolute value of a voltage after the low-pass filtering when the demodulation signal and the reference signal (rectangle wave) are multiplied at the in-phase (i.e. $\phi=0$) is |Va|, the voltage Va1 is represented by the equation (18) because the reference signal is shifted by 90 degree and mixed with the demodulation signal. Similarly, the voltage Va2 outputted from the low-pass filter 59 is represented by the equation (19).

$$Va1 = |Va|\sin \phi \tag{18}$$

$$Va2 = |Va|\cos \phi \tag{19}$$

The relation between the oscillation frequency, the dielectric constant and the alternating current electric field applied to the small area of the dielectric substance will be described below with regard to the dielectric information apparatus having the basic circuit such as the lock-in amplifier and so on designed as mentioned above.

As shown in FIG. 26, when the alternating current voltage Vp which is a sine wave with a frequency fp is applied to the small area between the probe (i.e. cantilever 11, 24 or 34) and the electrode (i.e. stage 13 or substrate 23, 33) by the alternating current signal generator (15, 26, 36), the alternating current electric field Ep, which is proportional to an amplitude of the alternating current voltage Vp, namely, which has a sine wave with the frequency fp, is induced in the small area. The alternating current voltage Vp and the alternating current electric field Ep can be represented by the equation (21) and the equation (22) by using an angular frequency ωp represented by the equation (20). Here, $Vp_0$ is an amplitude of the alternating current voltage Vp, and $Ep_0$ is an amplitude of the alternating current electric field Ep.

$$\omega p = 2\pi fp \tag{20}$$

$$Vp = Vp_0 \cos \omega p \tag{21}$$

$$Ep = Ep_0 \cos \omega p \tag{22}$$

Also, a dielectric constant εt of the small area when the alternating current voltage Vp is applied is represented by the equation (23) by using the alternating current electric field Ep, a second dielectric constant $\epsilon_2$, a third dielectric constant $\epsilon_3$ and a fourth dielectric constant $\epsilon_4$, as well known.

$$\epsilon t = \epsilon_2 + \epsilon_3 Ep + (1/2)\epsilon_4 Ep^2 \tag{23}$$

Here, the equation (23) can be introduced as follows. When an electric field is applied to a dielectric substance, an electrical flux density and an electric field are assumed to be D and E, respectively, an electrical entropy and an inner energy accumulated in a unit volume of the dielectric substance are assumed to be H and U, respectively, and the differentiations of the electrical flux density D, the electric field E, the inner energy U and the electrical entropy H are dD, dE, dU and dH, respectively. Then, the equation (24) and the equation (25) are established as follows.

$$dU = EdD \tag{24}$$

$$H = U - ED \tag{25}$$

From the above-mentioned equations (24), (25), the differentiation dH is represented by the equation (26). Thus, the electrical flux density D is represented by the equation (27).

$$dH = -DdE \tag{26}$$

$$D = -\partial H/\partial E \tag{27}$$

Next, when the Taylor expansion is carried out up to a fourth item at an origin by using the electrical entropy H as a function of the electric field E, the electrical entropy H is given by the equation (28).

$$H = (1/2)(\partial^2 H/\partial E^2)_0 E^2 + (1/6)(\partial^3 H/\partial E^3)_0 E^3 + (1/24)(\partial^4 H/\partial E^4)_0 E^4 \tag{28}$$

Here, the zeroth item is 0 since an energy accumulated in the field at the electric field E=0 is assumed to be 0. Also, the first item is 0 from the fact that the electrical flux density is D=0 at the electric field E=0 and from the equation 10. Also, from the equations (27), (28), the electric flux density D is represented by the equation (29).

$$D = -(\partial^2 H/\partial E^2)_0 E - (1/2)(\partial^3 H/\partial E^3)_0 E^2 - \qquad (29)$$
$$(1/6)(\partial^4 H/\partial E^4)_0 E^3$$
$$= \varepsilon_2 E + (1/2)\varepsilon_3 E^2 + (1/6)\varepsilon_4 E^3$$

Here, $$-(\partial^2 H/\partial E^2)_0 = \varepsilon_2 \tag{30}$$

$$-(\partial^3 H/\partial E^3)_0 = \varepsilon_3 \tag{31}$$

$$-(\partial^4 H/\partial E^4)_0 = \varepsilon_4 \tag{32}$$

In view of the above-mentioned explanation, when the Taylor expansion is performed on the electric entropy H, $\epsilon_2$ corresponding to the second expansion coefficient is referred to as the second dielectric constant, $\epsilon_3$ corresponding to the third expansion coefficient is referred to as the third dielectric constant, and $\epsilon_4$ corresponding to the fourth expansion coefficient is referred to as the fourth dielectric constant. Moreover, in the equation (29), let us consider the case that a micro electric field ΔE corresponding to an oscillation signal is superimposed on the alternating current electric field Ep. At this time, when an electric flux density corresponding to the alternating current electric field Ep is assumed to be Dp and a micro electric flux density corresponding to the micro electric field ΔE is assumed to be ΔD, the equation (29) can be represented as the equation (33).

$$Dp + \Delta D = \epsilon_2 (Ep + \Delta E) + (1/2)\epsilon_3 (Ep + \Delta E)^2 + (1/6)\epsilon_4 (Ep + \Delta E)^3 \tag{33}$$

Here, the electric flux density Dp is represented by the equation (34), and the micro electric field ΔE is much smaller than the alternating current electric field Ep. Thus, the item containing $(\Delta E)^2$ and $(\Delta E)^3$ can be made approximate to 0. Hence, ΔD of the second item of the equation (34) can be represented by the equation (35).

$$Dp = \varepsilon_2 Ep + (1/2)\varepsilon_3 Ep^2 + (1/6)\varepsilon_4 Ep^3 \tag{34}$$

$$\Delta D = \varepsilon_2 \Delta E + \varepsilon_3 Ep \Delta E + (1/2)\varepsilon_4 Ep^2 \Delta E \tag{35}$$
$$= \{\varepsilon_2 + \varepsilon_3 Ep + (1/2)\varepsilon_4 Ep^2\}\Delta E$$
$$= \varepsilon t \Delta E$$

As can be evident from the equation (35), the equation (23) can be introduced as a proportional coefficient εt between the micro electric flux density ΔD induced by the micro electric field ΔE and the micro electric field ΔE. The plus or minus of the third dielectric constant $\epsilon_3$ is inverted between the case when the direction of the alternating current electric field Ep is equal to the direction of the polarization P and the case when the direction of the alternating current electric field Ep is opposite to the direction of the polarization P. Also, in the equation (23), the dielectric constants of the degree higher than the fourth dielectric constant $\epsilon_4$ are ignored, the dielectric constants of the higher degree are much smaller than the second, third and fourth dielectric constants. Thus, in the following explanation, there is no influence of the ignorance of the dielectric constants of the higher degree. Also, in the following explanation, the equations are limited to the first dimension in the thickness direction of the dielectric substance, and they are provided. The capacitance Cs constituted by the small area sandwiched between the probe (i.e. cantilever 11, 24 or 34) and the electrode (i.e. stage 13 or substrate 23, 33) is proportional to the dielectric constant $\epsilon$t. Thus, it can be represented by the equation (36) by using the equation (23), a plus constant Ce determined by the dielectric substance, an area of a tip of the probe (i.e. cantilever 11, 24 or 34), and a thickness d of the dielectric substance.

$$Cs=Ce(1/d)\{\epsilon_2+\epsilon_3 Ep+(1/2)\epsilon_4 Ep^2\} \quad (36)$$

Also, the capacitance Cs represented by the equation (36) can be represented by the equation (39) by using a capacitance $C_0$ represented by the equation (37) and a capacitance change amount $\Delta C$ represented by the equation (38). Here, the capacitance $C_0$ is the capacitance constituted by the probe (i.e. cantilever 11, 24 or 34) and the electrode (i.e. stage 13 or substrate 23, 33) when the alternating current voltage Vp is not applied, and the small area sandwiched between the probe (i.e. cantilever 11, 24 or 34) and the electrode (i.e. stage 13 or substrate 23, 33). The capacitance change amount $\Delta C$ is the capacitance change amount from the capacitance $C_0$ when the alternating current voltage Vp is applied.

$$C_0=Ce(1/d)\epsilon_2 \quad (37)$$

$$\Delta C=Ce(1/d)\{\epsilon_3 Ep+(1/2)\epsilon_4 Ep^2\} \quad (38)$$

$$Cs=C_0+\Delta C \quad (39)$$

By substituting the alternating current electric field Ep represented by the equation (22) for the right side of the equation (30) and further changing by using the formula (40) of a trigonometric function, $\Delta C$ can be represented by the equation (41).

$$\cos^2(\omega p \cdot t)=\{1+\cos(2\omega p \cdot t)\}/2 \quad (40)$$

$$\Delta C=Ce(1/d)\{\epsilon_4 Ep_0^2/4+\epsilon_3 Ep_0 \cos(\omega p \cdot t)+(\epsilon_4 Ep_0^2/4)\cos(2\omega p \cdot t)\} \quad (41)$$

Moreover, the equation (41) can be converted into the equation (45) by using the capacitance change amounts $\Delta C_2$, $\Delta C_3$ and $\Delta C_4$ represented in the equations (42), (43) and (44). Here, the capacitance change amount $\Delta C_2$ is the change amount which is proportional to the fourth dielectric constant $\epsilon_4$ and the square of the amplitude $Ep_0$ of the alternating current electric field Ep and is not temporally changed. The capacitance change amount $\Delta C_3$ is the capacitance change amount which has the amplitude proportional to the third dielectric constant $\epsilon_3$ and the amplitude $Ep_0$ of the alternating current electric field Ep and has an angular frequency $\omega p$ and is alternately changed. And, the capacitance change amount $\Delta C_4$ is the capacitance change amount which has the amplitude proportional to the fourth dielectric constant $\epsilon_4$ and the square of the amplitude $Ep_0$ of the alternating current electric field Ep and has an angular frequency $2\omega p$ and is alternately changed.

$$\Delta C_2=Ce(1/d)(\epsilon_4 Ep_0^2/4) \quad (42)$$

$$\Delta C_3=Ce(1/d)\epsilon_3 Ep_0 \cos(\omega p \cdot t) \quad (43)$$

$$\Delta C_4=Ce(1/d)(\epsilon_4 Ep_0^2/4)\cos(2\omega p \cdot t) \quad (44)$$

$$\Delta C=\Delta C_2+\Delta C_3+\Delta C_4 \quad (45)$$

On the other hand, the capacitance Cs and the inductor L constitute the LC resonating circuit, as mentioned above. As well known, a resonation frequency $f_{LC}$ of the LC resonating circuit is represented by the equation (46).

$$f_{LC}=1/\{2\pi\sqrt{(L \cdot Cs)}\}$$
$$=1/[2\pi\sqrt{\{L \cdot (C_0+\Delta C)\}}] \quad (46)$$

Also, $\epsilon_3 Ep_0$ in the equation (43) and $\epsilon_4 Ep_0^2/4$ in the equation (36) are much smaller than the second dielectric constant $\epsilon_2$. Thus, from the equations (37), (38), $C_0 >> \Delta C$ is established. Hence, when the equation (46) is converted by using the approximation expression represented by the equation (47), the relation between the capacitance change amount $\Delta C$ and the resonance frequency change amount $\Delta f_{LC}$ can be represented by the equation (48).

$$\sqrt{(1+\Delta C/C0)}=(1+\Delta C/C0)-1/2 \approx 1-(1/2)(\Delta C/C0) \quad (47)$$

$$\Delta C/C0=-2\Delta f_{LC}/f_{LC} \quad (48)$$

As mentioned above, the resonance frequency $f_{LC}$ of the LC resonating circuit is changed by the resonance frequency change amount $\Delta f_{LC}$, proportionally to the capacitance change amount $\Delta C$ of the capacitance Cs. Thus, the oscillator 20 oscillates and generates the oscillation signal having the oscillation frequency $f_{OSC}$ that is the same frequency as the resonance frequency $f_{LC}$, and outputs to the FM demodulator 21. Here, as mentioned above, the resonance frequency $f_{LC}$ of the LC resonating circuit is changed by the resonance frequency change amount $\Delta f_{LC}$, proportionally to the capacitance change amount $\Delta C$ of the capacitance Cs. Hence, similarly, the oscillation frequency $f_{OSC}$ is changed proportionally to the capacitance change amount $\Delta C$ of the capacitance Cs. Also, as mentioned above, the capacitance change amount $\Delta C$ contains: the capacitance change amount $\Delta C_3$, which has the amplitude proportional to the third dielectric constant $\epsilon_3$ and the amplitude $Ep_0$ of the alternating current electric field Ep and has the angular frequency $\omega p$ and is alternately changed; and the capacitance change amount $\Delta C_4$, which has the amplitude proportional to the fourth dielectric constant $\epsilon_4$ and the square of the amplitude $Ep_0$ of the alternating current electric field Ep and has the angular frequency $2\omega p$ and is alternately changed. Thus, the oscillation signal is the oscillation signal that is frequency-modulated in accordance with: a signal S3 which has the amplitude proportional to the third dielectric constant $\epsilon_3$ and the amplitude $Ep_0$ of the alternating current electric field Ep and has the angular frequency $\omega p$, namely, a frequency fp; and a signal S4 which has the amplitude proportional to the fourth dielectric constant $\epsilon_4$ and the square of the amplitude $Ep_0$ of the alternating current electric field Ep and has the angular frequency $2\omega p$, namely, a frequency 2fp. At this time, the frequency shift of the frequency-modulated oscillation signal is proportional to the amplitude of the signal S3 and the amplitude of the signal S4.

The FM demodulator 21 performs the FM demodulation process on the oscillation signal, and outputs the demodulation signal, which contains: the signal S3 having the amplitude proportional to the third dielectric constant $\epsilon_3$ and the amplitude $Ep_0$ of the alternating current electric field Ep and having the frequency fp,; and the signal S4 having the amplitude proportional to the fourth dielectric constant $\epsilon_4$ and the square of the amplitude $Ep_0$ of the alternating current electric field Ep and having the frequency 2fp, to the terminal T1 of the lock-in amplifier 5.

In the lock-in amplifier 5, the mixer 56 multiplies and mixes one demodulation signal distributed as the in-phase after the amplification and the reference signal in which the wave form is converted and the phase is shifted by 90 degree, and converts into the signal having the frequencies of the sum and the difference between the frequency of the demodulation signal and the frequency of the reference signal, and then outputs it to the low-pass filter 58. The low-pass filter 58 outputs only an output voltage |Va| sin φ that is a direct current component of the signal after the mixing to the terminal T3. On the other hand, the mixer 57 multiplies and mixes the other demodulation signal distributed as the in-phase and the reference signal whose wave form is converted, and converts into the signal having the frequencies of the sum and the difference between the frequency of the demodulation signal and the frequency of the reference signal, and then outputs it to the low-pass filter 59. The low-pass filter 59 outputs only an output voltage |Va| cos φ that is a direct current component of the signal after the mixing to the terminal T4.

Here, the signal S3 is the signal having the frequency fp of the reference signal. Thus, the mixer 58 and the mixer 57 output the output voltage |Va| sin θ and the output voltage |Va| cos θ which are the direct current signals generated when the reference signal and the signal S3 having the frequency fp are multiplied and mixed, respectively. That is, the output voltage Va1 and the output voltage Va2 are the voltages corresponding to the phase difference φ and the third dielectric constant $\epsilon_3$. In particular, if the third dielectric constant $\epsilon_3$ is the real number and the plus value, the capacitance change amount $\Delta C_3$ and the alternating current electric field Ep are changed in the in-phase, as evident from the equation (34). Also, the capacitance change amount $\Delta C_3$ and the resonance frequency change amount $\Delta f_{LC}$ are changed in the opposite phase, as evident from the equation (39).

From the above-mentioned explanations, when the third dielectric constant $\epsilon_3$ is the real number and the plus value, the resonance frequency change amount $\Delta f_{LC}$ is changed in the phase opposite to that of the electric field electric field Ep. Moreover, the alternating current electric field Ep and the alternating current voltage Vp are changed in the in-phase. Thus, when the third dielectric constant $\epsilon_3$ is the real number and the plus value, the phase difference between the reference signal and the signal S3 is π. Similarly, when the third dielectric constant $\epsilon_3$ is the real number and the minus value, the phase difference between the reference signal and the signal S3 is 0.

As mentioned above, when the third dielectric constant $\epsilon_3$ is the real number, the phase difference between the reference signal and the signal 3 is 0 or π, and the output voltage Va1 is 0, and only the output voltage Va2 is outputted. Also, when the third dielectric constant $\epsilon_3$ is plus, the phase difference is π, and the output voltage Va2 is outputted as the minus value. On the other hand, when the third dielectric constant $\epsilon_3$ is minus, the phase difference is 0, and the output voltage Va2 is outputted as the plus value.

Therefore, the output varies depending on the plus or minus of third dielectric constant $\epsilon_3$, and the output level varies depending on the extent of the plus or minus. In this manner, it is possible to detect the polarization state of the small area.

Second Embodiment

Figure 11:
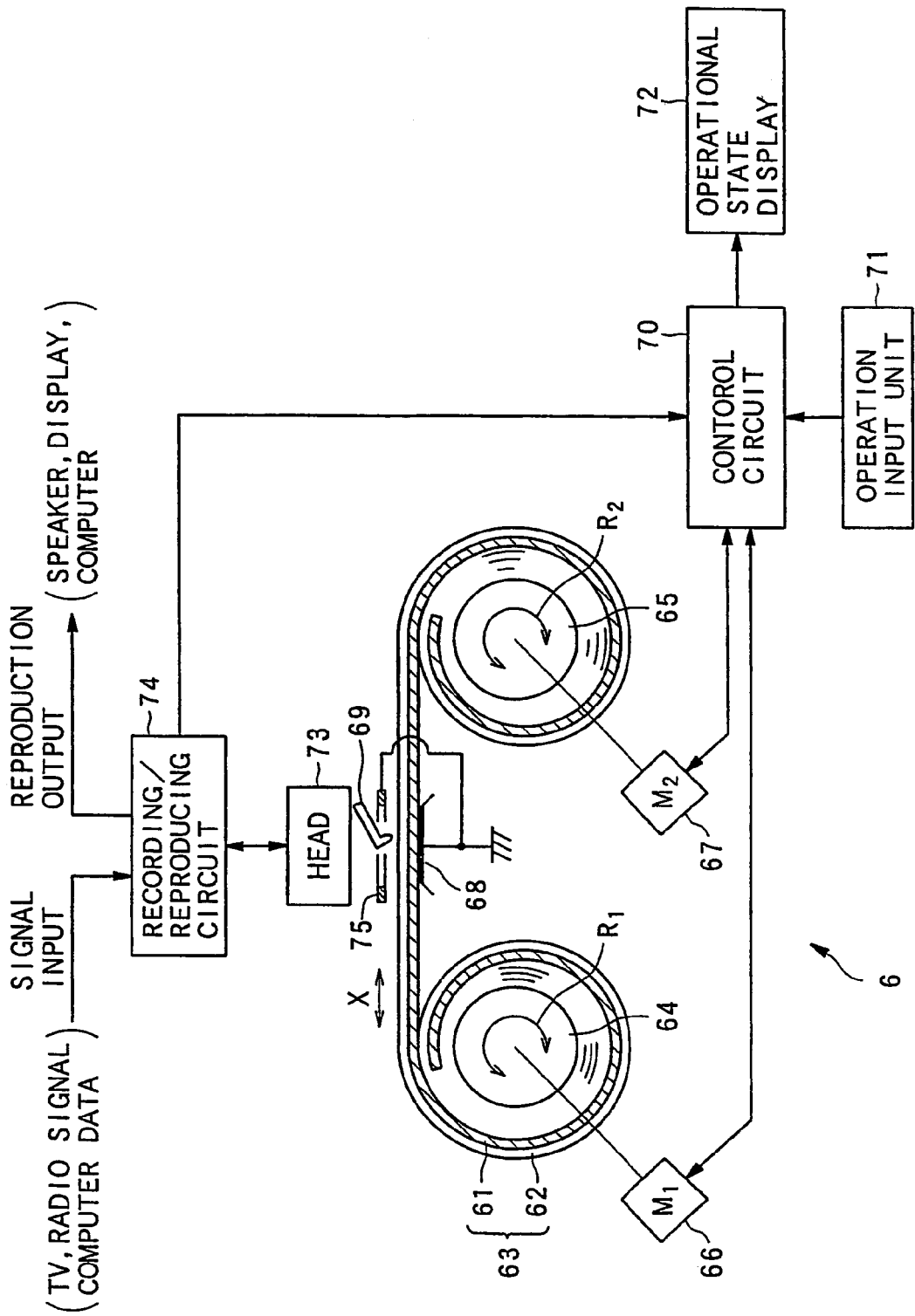
FIG. 11 is a block diagram showing a configuration of an information recording/reproducing apparatus using a tape-like dielectric record medium in a second embodiment of the present invention.

An information recording/reproducing apparatus 6 using a dielectric substance recording medium formed in a shape of a tape will be described below with reference to FIG. 11.

At first, as for a dielectric substance serving as a recording medium, a dielectric film made of dielectric substances is formed on a conductive tape-like substrate by using a known method, for example, such as, a sputtering and the like.

As the dielectric material, the following materials may be used.

(a) a PZT material as being a solid solution of $PbTiO_3$—$PbZrO_3$.
(b) lead titanate represented as $PbTiO_3$.
(c) lead zirconate represented as $PbZrO_3$.
(d) barium titanate represented as $BaTiO_3$.
(e) lithium niobate represented as $LiNbO_3$.
(f) a PLZT material as being a solid solution of lead (Pb), lantern (La), zirconium (Zr), and titanium (Ti).
(g) a BNPB material as being a solid solution of bismuth (Bi), sodium (Na), lead (Pb), and barium (Ba).

These materials may be used as the dielectric material in the form of ceramics, single crystal or a thin-film. Moreover, a piezoelectric polymer material, such as poly (vinylidene fluoride) (PDVF), copolymer of vinylidene fluoride and trifluoroethylene, copolymer of vinylidene fluoride and tetrafluoroethylene, copolymer of vinylidene cyanide and vinyl acetate, can be used as well. Furthermore, a combination with a plurality of the above materials can be also used.

At first, in the schematic configuration of the information recording/reproducing apparatus 6, it includes: a tape-like dielectric record medium 63 composed of a conductive thin film substrate 61 and a dielectric substance thin film 62 forming a recording section formed on the substrate 61 by using a predetermined method; winding shafts 64, 65; motors 66, 67 for driving the winding shafts 64, 65; a base 68 serving as a device for grounding the thin film substrate 61 of the dielectric record medium 61; cantilevers 69; a control circuit 70; an operation input unit 71; an operational state display 72; a head 73; a recording/reproducing circuit 74, an electrode 75, and another known mechanism required to run a tape and carry out a recording/reproducing operation.

The operation will be described below. The dielectric record medium 63 is wound in a direction of an arrow X, under the condition that it is in contact with the base 68 and the cantilevers 69, by the winding shafts 64, 65, or sent out and run. The winding shafts 64, 65 are respectively linked to the motors 66, 67 rotated in accordance with the control signal of the control circuit 70, and they are respectively rotated in directions R1, R2 to thereby carry out the winding and sending operations. The control circuit 70 controls not only the rotations of the motors 66, 67 but also the operation of the entire apparatus. Data is inputted from various sensors (not shown) placed in the necessary portions of the apparatus so that the recording/reproducing apparatus 6 is controlled so as to be normally actuated by a programmed CPU.

Also, the control circuit 70 receives an operation indicating signal inputted from the operation input unit 71, and actuates the information recording/reproducing apparatus 6 in accordance with the indication, and then displays the operational state on the operational state display 72. The input indication includes the indications similar to those of the conventional apparatus using the magnetic tape, for example, such as a selection of a recording or a reproducing, a start, a stop, a fast feeding, a rewinding and the like. Also, the operational state to be displayed includes the states similar to those of the operational displays of the conventional apparatus also using the magnetic tape, for example, such as a state currently being recorded or reproduced, a state of a fast feeding or a rewinding, an address of a current portion of the recording or reproducing operation, and the like.

Next, the head 73 has the cantilevers 69, and includes circuits for applying or reading information to or from them. A plurality of cantilevers 69 are placed in a direction vertical to a paper surface of FIG. 11. Each circuit, which is mounted on the head 73, includes, for example, the oscillator 39, the inductor L, the capacitances Ca and the like shown in FIG. 9 and the like. The record information sent to the head 73 and the read reproduction information is processed by the recording/reproducing circuit 74. This recording/reproducing circuit 74 includes, for example, the alternating current signal generators 36, the record signal generator 37, the FM demodulator 40 and the signal detector 41 shown in FIG. 9 and the like. The electrode 75 is intended to return to the earth the high frequency electric field emitted from the cantilevers 69. Incidentally, the configurations and the operations of the respective members are similar to those of the first embodiment and the like.

As the recorded information, there are a picture signal and a voice signal for a television, a radio and the like, and a computer data. The reproduction output is outputted as a voice from a speaker, or outputted as a picture on a display, and used as a program and a data for a computer.

Incidentally, the apparatus having both of the recording and reproducing functions has been described as the taped-like medium recording/reproducing apparatus. However, even the tape-like medium recording apparatus having only the recording function or the tape-like medium reproducing apparatus having only the reproducing function can be configured by considering the function with regard to it.

Third Embodiment

Figure 12:
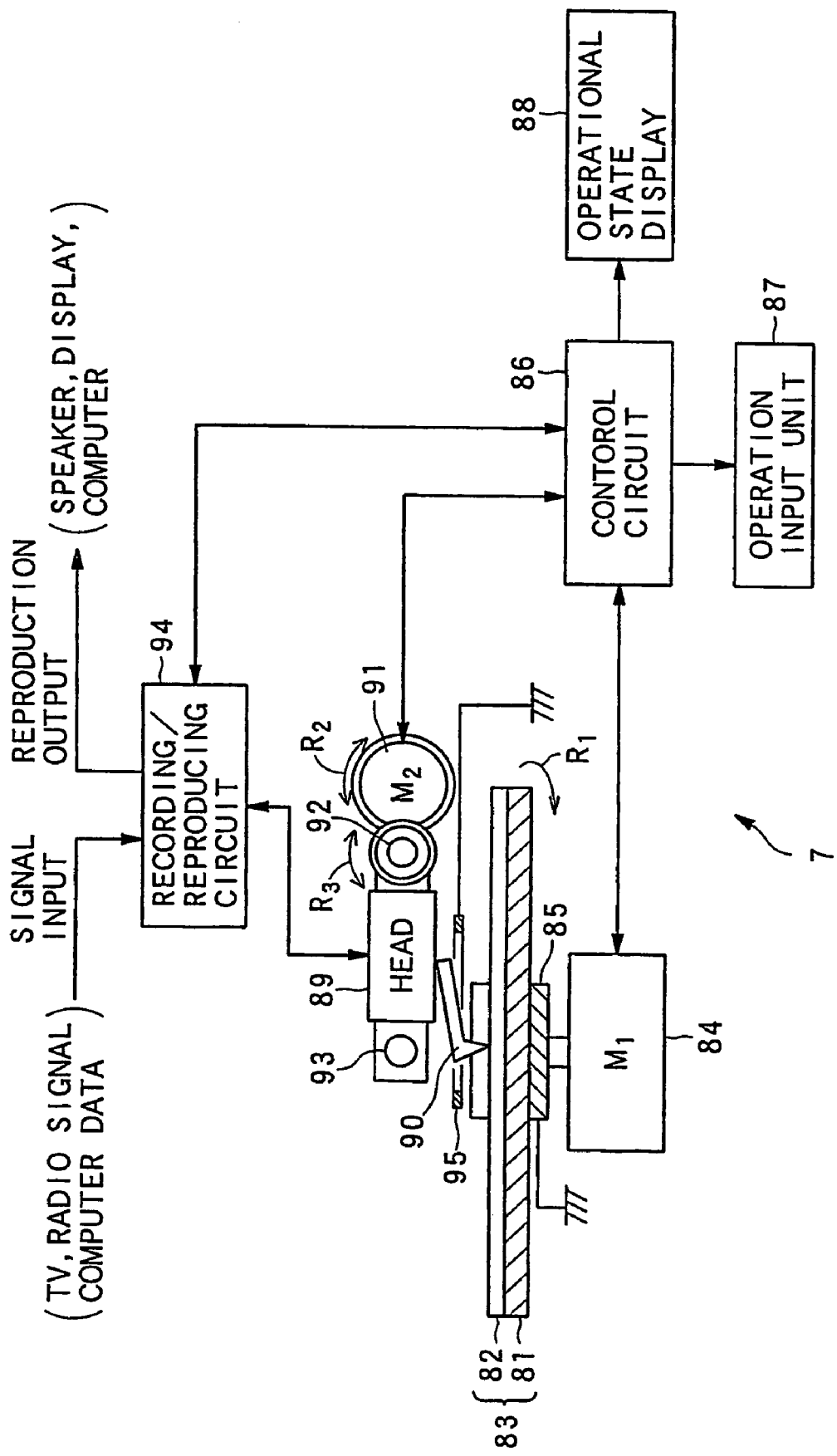
FIG. 12 is a block diagram showing a configuration of an information recording/reproducing apparatus using a disc-like dielectric record medium in a third embodiment of the present invention.

An information recording/reproducing apparatus 7 using a dielectric record medium that is disc-shaped is described with reference to FIG. 12. The dielectric material described above can be used.

At first, in the schematic configuration of the information recording/reproducing apparatus 7, it includes: a disc-like dielectric record medium 83 composed of a conductive substrate 81 and a dielectric substance thin film 82 forming a recording section formed on the substrate 81 by using a predetermined method; a motor 84 for rotating the disc; a rotation base 85 serving as a device for grounding the substrate 81 of the dielectric record medium 83; a control circuit 85; an operation input unit 87; an operational state display 88; a head 89; cantilevers 90; a motor 91 for moving the head 89 in a radius direction (in the vertical direction to the paper) of the disc; a screw 92; a shaft 93 for guiding the head, a recording/reproducing circuit 94, an electrode 95, and another known mechanism required to run a disc and carry out a recording/reproducing operation.

The operation will be described below. The dielectric record medium 83 is placed on the rotation base 85, and rotated in an R1 direction by the motor 84 controlled by the control circuit 86 under electrical connection. As the method of connecting the rotating rotation base 85 to the earth, it is possible to use a known technique such as a slip ring and the like. The control circuit 86 controls the operation of the entire apparatus. Data is inputted from various sensors (not shown) placed in the necessary portions of the apparatus so that the recording/reproducing apparatus 7 is controlled so as to be normally actuated by a programmed CPU.

Also, the control circuit 86 receives an operation indicating signal inputted from the operation input unit 87, and actuates the information recording/reproducing apparatus 7 in accordance with the indication, and displays the operational state on the operational state display 88. The input indication includes the indications similar to those of the conventional apparatus using the disc, for example, such as a selection of a recording or a reproducing, a start, a stop, a movement of the head 89 and the like. Also, the operational state to be displayed includes the states similar to those of the operational displays of the conventional apparatus also using the disc, for example, such as a state currently being recorded or reproduced, a position of the head, an address of a current portion of the recording or reproducing operation, and the like.

Next, the head 89 rotates and moves the screw 92 in the radius direction (in the vertical direction to the paper) of the dielectric record medium 83, by using the motor 91. The shaft 93 makes a pair with the screw 92 and supports so that the head 89 smoothly can move. This head 89 has a plurality of the cantilevers 90, and includes circuits for applying or reading information to or from the cantilevers 90. Each circuit includes, for example, the oscillator 39, the inductor L, the capacitances Ca to Cn shown in FIG. 9 and the like.

The reproduction information read by the head 89 is processed by the recording/reproducing circuit 94. This recording/reproducing circuit 94 includes, for example, the alternating current signal generators 36, the record signal generator 37, the FM demodulator 40, the signal detector 41 shown in FIG. 9 and the like. The electrode 95 is intended to return to the earth the high frequency electric field emitted from the cantilever 90. Incidentally, the configurations and the operations of the respective members are similar to those of the first embodiment and the like.

As the recorded information, there are a picture signal and a voice signal for a television, a radio and the like, and a computer data. The reproduction output is outputted as a voice from a speaker, or outputted as a picture on a display, and used as a program and a data for a computer.

Incidentally, the apparatus having both of the recording and reproducing functions has been described as the disc-like medium recording/reproducing apparatus. However, even the disc-like medium recording apparatus having only the recording function or the disc-like medium reproducing apparatus having only the reproducing function can be configured by considering the function, with regard to it As explained above in detail, in the above-mentioned two recording/reproducing apparatuses 6, 7, the outstanding features of the present invention lie in the usage of the plurality of probes having the very high trace ability of the cantilever type and the action of the plurality of probes installed in one oscillator. It is possible to simultaneously read out the information recorded on the medium by applying the alternating electric fields of the low frequencies, which are different from each other, from the probe side, between the common grounded electrode, which is placed on one surface of the dielectric thin film, and the electrode composed of the plurality of probes formed so as to be brought into contact with the small area of the dielectric substance (or brought into contact through micro gap). Moreover, it is possible to simultaneously record by superimposing the record signal on the low frequency alternating electric fields.

Moreover, the circuit for applying the low frequency voltage and the high frequency circuit of the oscillator including the LC resonator are separated from each other by L and C. Thus, it is possible to record and reproduce the sufficiently separated signal without any interference between the resonators.

Furthermore, it is enough that the power supplies for applying the low frequency alternating current electric fields can be oscillated at fixed frequencies different from each other. Thus, they are simple and easily integrated. One high frequency oscillator is designed such that one can be commonly used by the plurality of probes. Hence, it is possible to attain the super small type of the super high density dielectric recording/reproducing apparatus.

Incidentally, in the respective embodiments as described above, the dielectric substances constituting the dielectric record mediums 21, 31, 63, and 83 are preferably made of the ferroelectric substance. Consequently, the information can be written to the small area of the ferroelectric substance at the high density, in the further excellent manner.

INDUSTRIAL APPLICABILITY

The dielectric constant measuring apparatus and the dielectric constant measuring method can be applied to an information recording and/or reproducing apparatus using a dielectric record medium. The information recording and/or reproducing apparatus is used for recording information, such as picture information, sound information, computer program data and so on, at a high density and/or reproducing the recorded information.

The invention claimed is:

1. A dielectric constant measuring apparatus for measuring a dielectric constant of a dielectric substance, comprising:
    a probe having a small projection on a tip side of a cantilevered electric conductor;
    an electrode which is placed around the probe and which is set at a predetermined electric potential;
    an inductor placed so as to constitute a resonance circuit together with a capacitance in a small area of the dielectric substance that the probe contacts;
    an oscillating device connected to the resonance circuit;
    a demodulating device for demodulating an oscillation frequency of the oscillating device; and
    a detecting device for detecting dielectric constant information from a demodulation signal of the demodulating device.

2. A dielectric constant measuring apparatus according to claim 1, characterized in that the detecting device includes a calculating device for determining the dielectric constant of the dielectric substance by using oscillation frequency data which is obtained by making the probe contact with a dielectric sample having a known dielectric constant distribution and making the oscillating device oscillate on the basis of a capacitance of a small area of the dielectric sample.

3. A dielectric constant measuring apparatus according to claim 2, characterized in that the calculating device calculates an average dielectric constant of the dielectric substance on the basis of: (i) a working curve, which indicates a relationship between dielectric constants and oscillation frequencies with respect to a plurality of dielectric samples which have different known dielectric constants, and which is created on the basis of the oscillation frequency data which is obtained by making the probe contact with each of the plurality of dielectric samples and making the oscillating device oscillate on the basis of a capacitance of a small area of each of the plurality of dielectric samples; and (ii) an oscillation frequency obtained when the probe is stopped in a condition that the probe is in contact with the dielectric substance having a small dielectric constant distribution on its surface within a range including a portion where the probe and a member holding the probe face the dielectric substance, and then determines the dielectric constant distribution from changes of an oscillation frequency corresponding to the dielectric constant distribution by relatively scanning the probe contacting the dielectric substance.

4. A dielectric constant measuring apparatus according to claim 1, characterized in that the dielectric constant measuring apparatus further comprises an alternating current signal generating device for generating an alternating current signal to be applied to the probe.

5. A dielectric constant measuring apparatus according to claim 4, characterized in that the dielectric constant measuring apparatus further comprises a cutoff device for cutting off the alternating current signal with respect to the oscillating device.

6. A dielectric constant measuring apparatus according to claim 4, characterized in that the dielectric constant information is detected by the detecting device using a synchronous detection by the demodulation signal and the alternating current signal.

7. A dielectric constant measuring apparatus according to claim 1, characterized in that the dielectric constant measuring apparatus comprises a plurality of the probes and a plurality of the alternating current signal generating devices, and the plurality of the alternating current signal generating devices supply a plurality of the alternating current signals which have different frequencies from each other to the plurality of the probes, respectively.

8. A dielectric constant measuring apparatus according to claim 1, characterized in that the electrode is grounded.

9. A dielectric constant measuring apparatus according to claim 1, characterized in that the dielectric constant measuring apparatus further comprises a stage on which the dielectric substance is placed, which is located opposite the probe, and which is grounded.

10. A dielectric constant measuring apparatus according to claim 1, characterized in that the dielectric substance is a ferroelectric substance.

11. An information recording/reproducing apparatus for recording and reproducing information with respect to a tape-like dielectric record medium, comprising:
    a moving device for moving the dielectric record medium straight;
    a probe having a small projection on a tip side of a cantilevered electric conductor, for reading out and recording the information by being made to be in contact with the dielectric record medium;
    an electrode which is placed around the probe and which is set at a predetermined electric potential; and
    a circuit device for generating a signal corresponding to the information and recording the signal through the probe, and for reading out and reproducing the recorded information through the probe.

12. An information recording/reproducing apparatus according to claim 11, characterized in that the information recording/reproducing apparatus comprises a plurality of the probes and a plurality of the alternating current signal generating devices for supplying a plurality of the alternating current signals which have different frequencies from each other to the plurality of the probes, respectively.

13. An information recording/reproducing apparatus according to claim 11, characterized in that the electrode is grounded.

14. An information recording/reproducing apparatus according to claim 11, characterized in that the information recording/reproducing apparatus further comprises a conductive base which is placed such that the dielectric record medium is sandwiched between the probe and the conductive base.

15. An information recording/reproducing apparatus according to claim 11, characterized in that the dielectric record medium is made by using a ferroelectric substance.

16. An information recording/reproducing apparatus for recording and reproducing information with respect to a disc-like dielectric record medium, comprising:
- a rotating device for rotating the dielectric record medium;
- a probe having a small projection on a tip side of a cantilevered electric conductor, for reading out and recording the information by being made to be in contact with the dielectric record medium;
- an electrode which is placed around the probe and which is set at a predetermined electric potential;
- a circuit device for generating a signal corresponding to the information and recording the signal through the probe, and for reading out and reproducing the recorded information through the probe; and
- a moving device for moving the probe in a radius direction of the dielectric record medium.

17. An information recording/reproducing apparatus according to claim 16, characterized in that the information recording/reproducing apparatus comprises a plurality of the probes and a plurality of the alternating current signal generating devices for supplying a plurality of the alternating current signals which have different frequencies from each other to the plurality of the probes, respectively.

18. An information recording/reproducing apparatus according to claim 16, characterized in that the electrode is grounded.

19. An information recording/reproducing apparatus according to claim 16, characterized in that the information recording/reproducing apparatus further comprises a conductive rotation base, which is placed such that the dielectric record medium is sandwiched between the probe and the conductive base, and which is rotated by the rotating device.

20. An information recording/reproducing apparatus according to claim 16, characterized in that the dielectric record medium is made by using a ferroelectric substance.

21. A dielectric constant measuring method of measuring a dielectric constant of a dielectric substance by using a dielectric constant measuring apparatus provided with: a probe having a small projection on a tip side of a cantilevered electric conductor; an electrode which is placed around the probe and which is set at a predetermined electric potential; an inductor placed so as to constitute a resonance circuit together with a capacitance in a small area of the dielectric substance that the probe contacts; an oscillating device connected to the resonance circuit; a demodulating device for demodulating an oscillation frequency of the oscillating device; and a detecting device for detecting dielectric constant information from a demodulation signal of the demodulating device, the method comprising:
- a working curve creating process of creating a working curve, which indicates a relationship between dielectric constants and oscillation frequencies with respect to a plurality of dielectric samples which have different known dielectric constants, on the basis of the oscillation frequency data which is obtained by making the probe contact with each of the plurality of dielectric samples and making the oscillating device oscillate on the basis of a capacitance of a small area of each of the plurality of dielectric samples;
- a calculating process of calculating an average dielectric constant basis of the working curve and an oscillation frequency obtained when the probe is stopped in a condition that the probe is contact with the dielectric substance having a small dielectric constant distribution on its surface within a range including a portion where the probe and a member holding the probe face the dielectric substance; and
- a determining process of determining the dielectric constant distribution from changes of an oscillation frequency corresponding to the dielectric constant distribution by relatively scanning the probe contacting the dielectric substance.

22. A dielectric constant measuring method according to claim 21, characterized in that the dielectric substance is a ferroelectric substance.

* * * * *